United States Patent
Sato et al.

(10) Patent No.: US 11,043,471 B2
(45) Date of Patent: Jun. 22, 2021

(54) MIXED-ORIENTATION MULTI-DIE INTEGRATED CIRCUIT PACKAGE WITH AT LEAST ONE VERTICALLY-MOUNTED DIE

(71) Applicant: Microchip Technology Incorporated, Chandler, AZ (US)

(72) Inventors: Justin Sato, West Linn, OR (US); Bomy Chen, Newark, CA (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/540,117

(22) Filed: Aug. 14, 2019

(65) Prior Publication Data
US 2020/0357767 A1 Nov. 12, 2020

Related U.S. Application Data

(60) Provisional application No. 62/845,833, filed on May 9, 2019.

(51) Int. Cl.
*H01L 25/065* (2006.01)
*H01L 23/00* (2006.01)
(Continued)

(52) U.S. Cl.
CPC ...... *H01L 25/0655* (2013.01); *H01L 21/4853* (2013.01); *H01L 23/13* (2013.01);
(Continued)

(58) Field of Classification Search
CPC ........... H01L 25/0655; H01L 23/49838; H01L 25/50; H01L 24/16; H01L 23/13;
(Continued)

(56) References Cited

U.S. PATENT DOCUMENTS

| 5,362,986 A * | 11/1994 | Angiulli | H01L 25/0652 257/690 |
| 8,703,543 B2 * | 4/2014 | Wan | B81B 3/0054 438/121 |
| 2011/0057306 A1 | 3/2011 | Mcshane et al. | 257/706 |

FOREIGN PATENT DOCUMENTS

WO 2018/125486 A1 7/2018 ............. H01L 23/00

OTHER PUBLICATIONS

International Search Report and Written Opinion, Application No. PCT/US2019/060388, 11 pages, dated Mar. 20, 2020.

* cited by examiner

*Primary Examiner* — Jasmine J Clark
(74) *Attorney, Agent, or Firm* — Slayden Grubert Beard PLLC

(57) ABSTRACT

A mixed-orientation multi-die ("MOMD") integrated circuit package includes dies mounted in different physical orientations. An MOMD package includes both (a) one or more dies horizontally-mounted dies (HMDs) mounted horizontally to a horizontally-extending die mount base and (b) one or more vertically-mounted dies (VMDs) mounted vertically to the horizontally-extending die mount base. HMDs may include FPGAs or other high performance chips, while VMDs may include low performance chips and other physical structures such as heat dissipators, memory, high voltage/analog devices, sensors, or MEMS, for example. The die mount base of an MOMD package may include structures for aligning and mounting VMD(s), for example, VMD slots for receiving each mounted VMD, and VMD alignment structures that facilitate aligning and/or guiding a vertical mounting of each VMD to the die mount base. MOMD packages may provide a reduced lateral footprint and increased die integration per unit area, as compared with conventional multi-die packages.

24 Claims, 25 Drawing Sheets

(51) Int. Cl.
*H01L 23/13* (2006.01)
*H01L 21/48* (2006.01)
*H01L 25/00* (2006.01)
*H01L 23/498* (2006.01)

(52) U.S. Cl.
CPC ........ *H01L 23/49838* (2013.01); *H01L 24/16* (2013.01); *H01L 25/50* (2013.01); *H01L 2224/10165* (2013.01); *H01L 2224/16225* (2013.01)

(58) Field of Classification Search
CPC . H01L 2224/16225; H01L 2224/10165; H01L 24/48; H01L 2924/15159; H01L 2224/05557
See application file for complete search history.

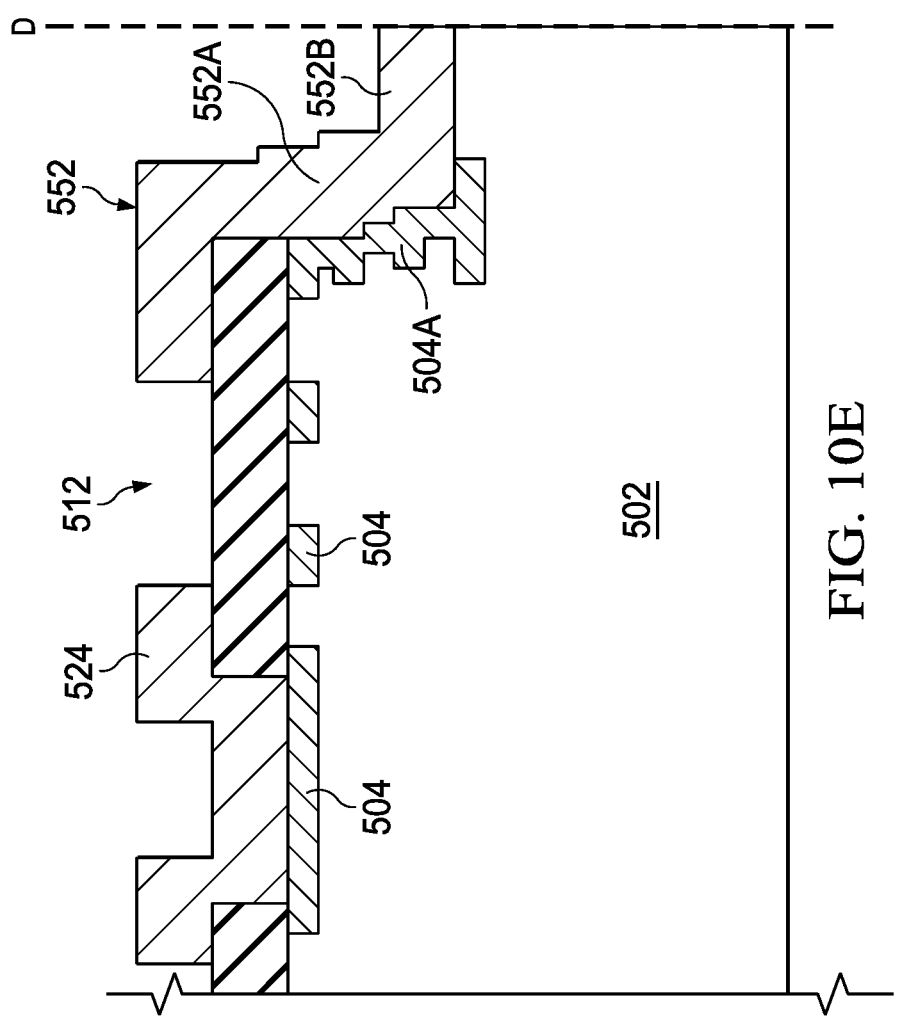

MIXED-ORIENTATION MULTI-DIE INTEGRATED CIRCUIT PACKAGE WITH AT LEAST ONE VERTICALLY-MOUNTED DIE

RELATED APPLICATION

This application claims priority to commonly owned U.S. Provisional Patent Application No. 62/845,833 filed May 9, 2019, the entire contents of which are hereby incorporated by reference for all purposes.

TECHNICAL FIELD

The present disclosure relates to integrate circuit packages, and more particularly to mixed-orientation multi-die integrated circuit packages with at least one horizontally-mounted die and at least one vertically-mounted die.

BACKGROUND

Moore's law has partially moved away from pure-Si process integration to die-assembly and heterogeneous die integration (i.e., a move from cost-per-transistor to cost-per-packaged transistor), e.g., for providing total-system-solutions (TSS) in a single package. For example, a heterogeneous multi-die package assembly may include multiple different types of dies mounted in a common multi-die package.

Known multi-die packages include 3-D or 2.5D heterogeneous die integration products including multiple dies mounted in a horizontal (flat) orientation on a package substrate, which in turn may be mounted on a printed circuit board (PCB). Multiple dies in the package may be connected to each other by interconnects or other connections formed in the package substrate or in a silicon "interposer" arranged between the dies and the package substrate.

For example, FIG. 1 shows a cross-section of an example multi-die FPGA package 10 by Intel Corporation, which includes an FPGA die 12 mounted centrally on a multi-die package substrate 14, and a number of DRAM dies (not shown) and transceiver dies 18 mounted on the package substrate 14 around the periphery of the FPGA 12 and each connected to the FPGA 12 by interconnects 20 formed in (i.e., routed through) the package substrate 14, referred to by Intel as Embedded Multi-die Interconnect Bridge (EMIB) connections. A package lid 22 is formed over the multi-die FPGA package 10 to seal the multi-die FPGA package 10.

The cross-section shown in FIG. 1 shows a pair of transceiver dies 18 on opposing sides of the FPGA die 12, with each transceiver die 18 connected to the FPGA 12 by EMIB interconnects 20 routed through the multi-die package substrate 14. As shown, the multi-die FPGA package 10 may be solder mounted on a PCB 24. The devices mounted on the package substrate 14 (FPGA 12, DRAM (not shown), and transceivers 18) are connected to electronics on the PCB 24 by "through-silicon vias" (TSVs) 26 extending vertically through the multi-die package substrate 14.

In other multi-die packages, the various dies in the package are connected to each other by interconnects formed in a discrete "interposer" structure provided between the dies and the multi-die package substrate. FIG. 2 shows a cross-section of an example multi-die FPGA package 50 by Xilinx, Inc. and Taiwan Semiconductor Manufacturing Company Limited (TSMC). The cross-sectional view of FPGA package 50 shows an FPGA die 52 and a memory die 54 solder mounted on a silicon interposer 56, which is in turn solder mounted on a package substrate 58. The silicon interposer 56 includes (a) interconnections 60 between FPGA 52 and memory 54 (and similar interconnections between other dies mounted on the silicon interposer 56), and (b) TSVs 62 extending vertically through the interposer 56 to connect the FPGA 52 and memory 54 to the package substrate 58 (and to electronics on a PCB to which the multi-die FPGA package 50 is mounted through TSVs or other connections (not shown) extending vertically though the package substrate 58).

There is a need for improved heterogeneous multi-die packages (packages include multiple different types of dies), for example, heterogeneous multi-die packages having a reduced footprint/area.

SUMMARY

Embodiments of the present invention provide multi-die IC packages with dies mounted in different physical orientations, referred to herein as mixed-orientation multi-die ("MOMD") packages. For example, an MOMD package according to some embodiments includes both (a) one or more dies mounted horizontally as horizontally-mounted dies or "HMDs" and (b) one or more dies mounted vertically as vertically-mounted dies or "VMDs." The terms "die" and "chip" are used interchangeably herein. Some MOMD package embodiments include at least one FPGA or other "high performance" chip (e.g., a chip that operates at 300 MHz or higher frequency) mounted horizontally as HMD(s), and at least one other chip mounted vertically as VMD(s). VMDs may include various types of devices, e.g., including "low performance" chips (e.g., chip that operate at <300 MHz frequency), and other physical structures such as heat dissipators, memory, high voltage/analog devices, sensors, or micro-electro-mechanical systems (MEMS), for example.

In some embodiments, MOMD packages may be more advanced with a smaller lateral footprint and may provide more die integration per unit area, as compared with existing designs, e.g., designs discussed above in the Background section.

In some embodiments, an MOMD package includes a horizontally-extending die mount base including structures for mounting both HMD(s) and VMD(s). The MOMD die mount base may include vertically-extending VMD slots for receiving at least a portion of each VMD mounted thereto. The MOMD may also include VMD alignment structures, e.g., extending vertically upward from an upper side of the horizontally-extending die mount base, that facilitate aligning and/or guiding a vertical mounting of each VMD, e.g., to guide a leading portion of the VMD into a respective VMD slot in the die mount base. The VMD alignment structures may also physically support each VMD in its mounted position. VMD alignment structures may be formed from a polymer (e.g., polyimide) or other suitable materials. In some embodiments, a VMD may include alignment structures, e.g., elongated rails or grooves, configure to interact with corresponding VMD alignment structures provided on the MOMD die mount base, to help align and/or guide the mounting of the VMD. Further, VMDs may include specialized contact pads, e.g., formed in a scribeline area of a VMD die wafer. In some embodiments, VMDs may include U-shaped, cup-shaped, or arched contacts configured to provide an effective engagement with corresponding contact pads provided on the MOMD die mount base.

In some embodiments, the MOMD die mount base may include contact pads for bonding HMD(s) and VMD(s) to the MOMD die mount base. In some embodiments, the MOMD die mount base may include a larger number of bond pads for mounting each HMD than each VMD, as each HMD (e.g., a high-performance die) may require more pin-outs or other contacts than each VMD. The MOMD die mount base may include interconnects and/or other structures for conductively connect all of the dice together, and may include bonds pads for wire-bonding the die mount base to an underlying package substrate.

In some embodiments, the MOMD die mount base includes solder-coated contact pads for the following functions: mounting HMDs, mounting VMDs, and/or wire bonding (e.g., to an underlying substrate or other device). The solder coated contact pads may provide improved bonding for HMDs, VMDs, and/or wire bonds.

In some embodiments, the MOMD die mount base is an interconnect-only device formed from a non-electrical grade silicon substrate, or other inexpensive substrate. In some embodiments, the MOMD die mount base may perform the upper-level metal routing for at least one (or all) dice bonded to the die mount base. For example, the MOMD die mount base may include metal routing layers 5-N (e.g., metal layers 5-12), such that a high-performance die (e.g., FPGA) mounted to the MOMD may be manufactured with only metal layers 1-4. Thus, for some HMDs, a partially processed foundry die (including a subset of metal layers) may be used, while the remaining metal layers (e.g., layers 5-10+) may be formed in the MOMD die mount base, e.g., using copper wiring, which may reduce the extremely expensive conventional foundry manufacturing costs for up to 12+ mask-layers for FPGA and other high performance chips.

In some embodiments, an MOMD package includes no transistors, but only low latency metal routing and specialized bond pads. In some embodiments, all dies are interconnected in the MOMD package with copper interconnects, which provides ultra-low latency. Further, in some embodiments, unlike certain existing products (e.g., products discussed above in the Background section), the MOMD package may include no TSV, and no interposer.

BRIEF DESCRIPTION OF THE DRAWINGS

Example aspects of the present disclosure are described below in conjunction with the figures, in which:

FIGS. 10A-10E illustrate an example process for forming U-shaped, cup-shaped, or arch-shaped contacts on a VMD, according to one example embodiment.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1:
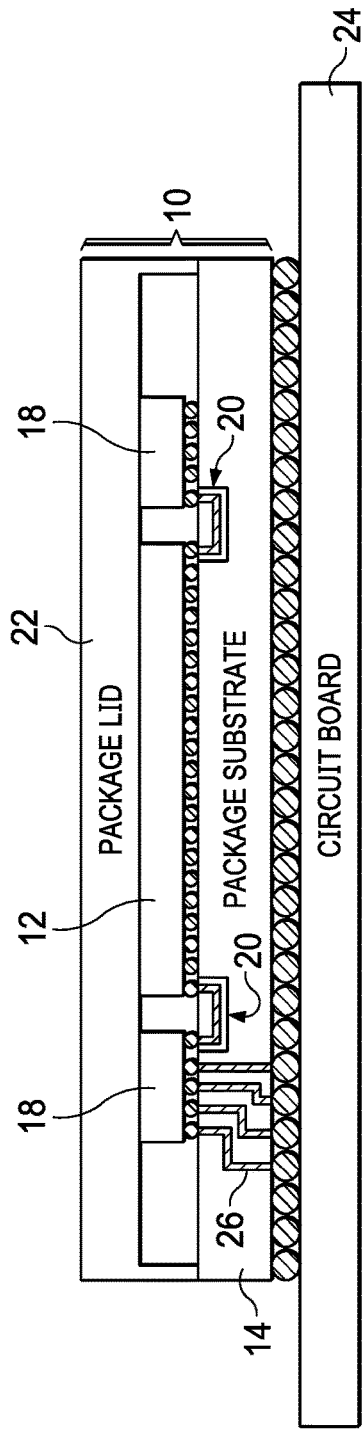
FIG. 1 shows a cross-section of a conventional multi-die FPGA package.
Figure 2:
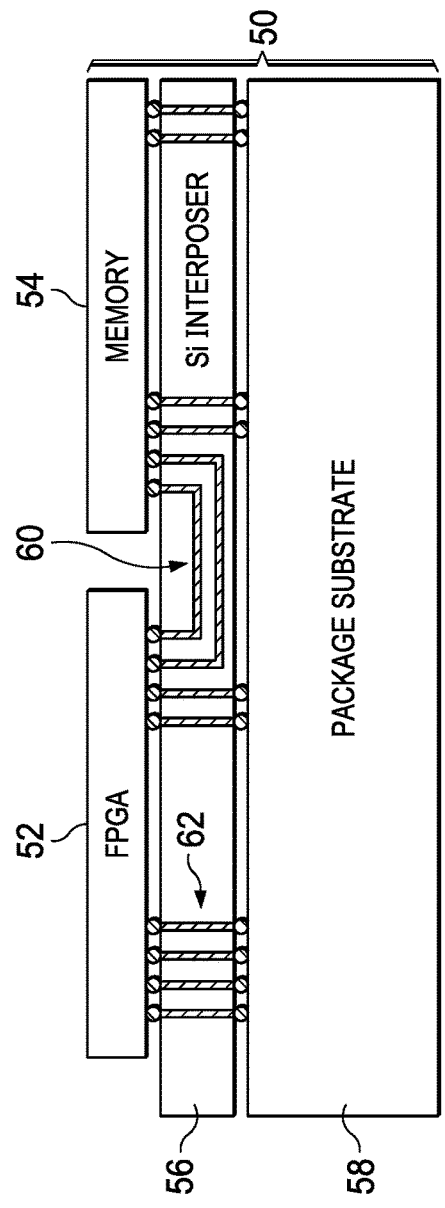
FIG. 2 shows a cross-section of another conventional multi-die FPGA package.
Figure 3A:
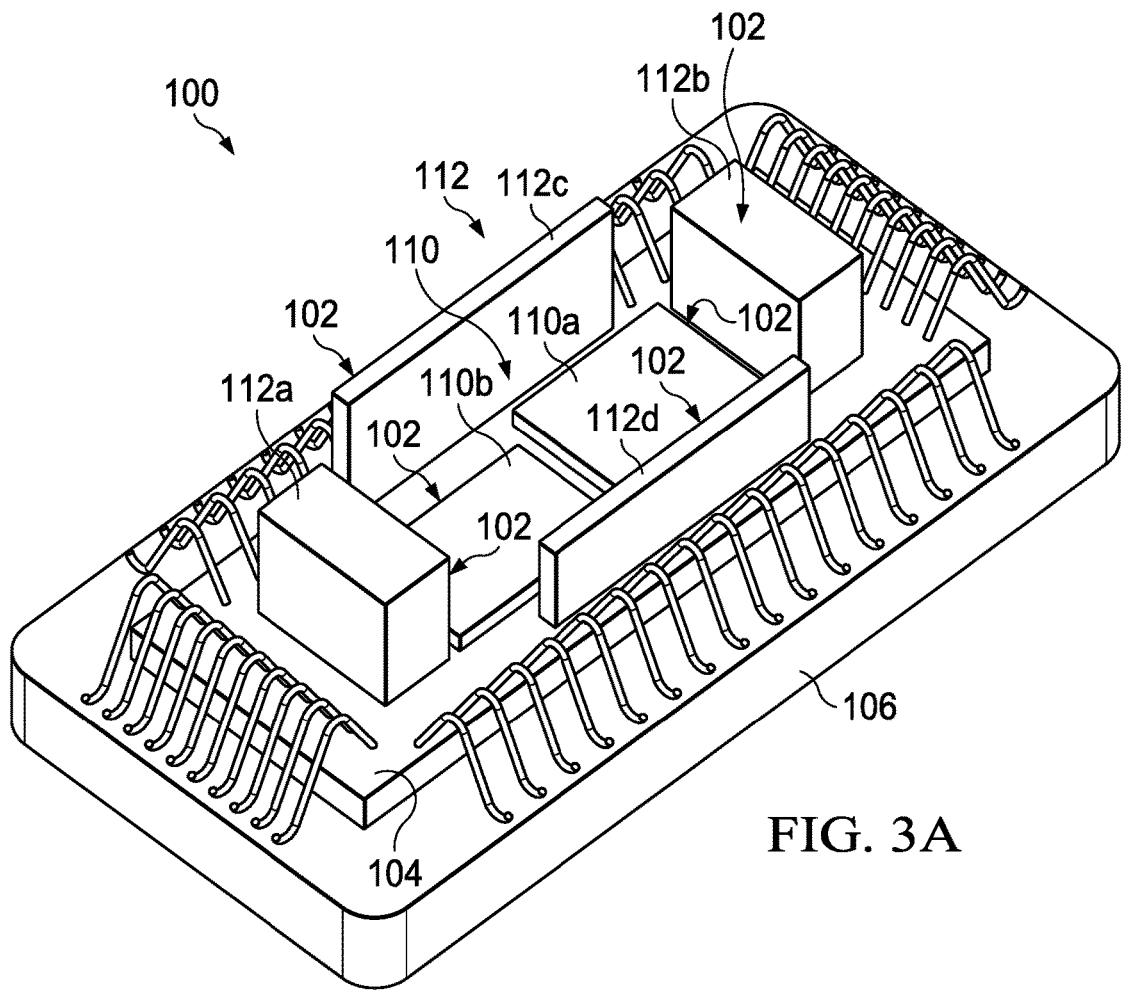
FIGS. 3A and 3B illustrate a top three-dimensional view and a side view, respectively, of an example mixed-orientation multi-die ("MOMD") package, according to one example embodiment of the present invention.
Figure 3B:
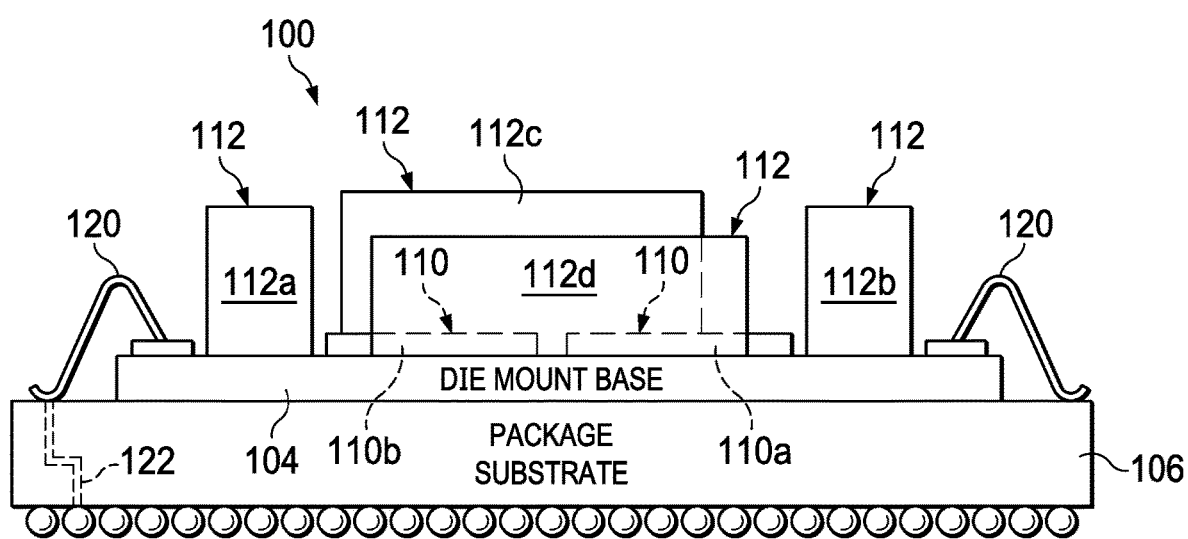

FIGS. 3A and 3B illustrate an example top three-dimensional view and an example side view, respectively, of an example mixed-orientation multi-die ("MOMD") package 100, according to one example embodiment of the invention. The example MOMD package 100 may include a plurality of dies 102 mounted on a horizontally-extending die mount base 104, which is in turn mounted on a package substrate 106. The plurality of dies 102 mounted on the horizontally-extending die mount base 104 may include multiple different types of dies, and one or more instance of each type of die. In addition, the plurality of dies 102 may be mounted on the horizontally-extending die mount base 104 in at least two different orientations, for example, horizontally and vertically, which defines a "mixed-orientation" package.

Example types of dies 102 may include: FPGA dies, graphic processing units (GPUs), microcontrollers, encryption or security related dies, power-related dies (e.g., DC-DC converters, supervisors, and/or low-dropout (LDO) regulators), high-voltage input/output dies, motor drivers, power drivers, digital-analog converters, analog-digital converters, LED drivers, smoke detectors, piezoelectric drivers, digital potentiometers, sensors, touch-sensing inputs (e.g., proximity/3D sensors, buttons, sliders, and/or touch screens), amplifiers, filters, clocks or other timing devices, memory devices (e.g., EEPROM, serial flash, and serial SRAM), USB devices (e.g., smart hubs, switches, transceivers, and/or bridges), auto/industrial communication devices (e.g., Media Oriented Systems Transport (MOST) devices, RS232 device, RS485 devices, Controller Area Network (CAN) devices, and/or Local Interconnect Network (LIN) devices, wireless communication devices (e.g., Wi-Fi devices, Bluetooth devices, LoRa devices, and/or zigbee/MiWi devices), and Ethernet devices), batteries, antennae, capacitors, inductors, heat sinks/heat dissipators, and/or any other types of devices suitable for inclusion in an integrated circuit package.

MOMD package 100 may include both (a) one or more dies 102 mounted horizontally as horizontally-mounted dies or "HMDs" 110 and (b) one or more dies 102 mounted vertically as vertically-mounted dies or "VMDs" 112. In some embodiments, it may be preferable or necessary to mount certain dies 102 on the horizontally-extending die mount base 104 horizontally as HMDs 110, e.g., to provide a sufficiently large area of contact between the die 102 and horizontally-extending die mount base 104, and/or to provide a sufficient or required number of conductive contacts between the die 102 and horizontally-extending die mount base 104 for the proper operation of the die 102. For example, it may be preferable or necessary to mount "high-performance" dies 102 horizontally as HMDs 110 to allow sufficient or required contacts between such dies 102 and the horizontally-extending die mount base 104 (e.g., for data communications between the die 102 and a PCB on which MOMD package 100 is mounted). As used herein, a high-performance die is configured for operation at an operating frequency of at least 300 MHz. Examples of high-performance dies include microcontrollers and microprocessors configured for operation at an operating frequency of at least 300 MHz, e.g., certain FPGA dies and graphics processing unit (GPU) dies.

Other dies 102, e.g., dies requiring a smaller area of contact between the die 102 and horizontally-extending die mount base 104, may be mounted on the horizontally-extending die mount base 104 vertically as VMDs 112, e.g., to reduce the total footprint of the MOMD package 100. For example, certain non-high-performance dies may be mounted vertically as VMDs 112.

As used herein, a die is "horizontally-mounted" (i.e., an HMD) if a largest side of the die lies in a plane extending parallel or substantially parallel with (≤45° offset from) the major plane of the package substrate (e.g., the largest side of the die lies in a horizontal plane parallel with a horizontally-oriented package substrate). In contrast, a die is "vertically-mounted" (i.e., a VMD) if a largest side of the die lies in a plane extending perpendicular or substantially perpendicular with (>45° offset from) the major plane of the package substrate (e.g., the largest side of the die lies in a vertical plane extending perpendicular from a horizontally-oriented package substrate). For a die having the shape of a rectangular solid, a largest side of the die is a side having a surface area at least as large as each other side of the die. For a die having a shape other than a rectangular solid, a largest side of the die is defined by the smallest rectangular solid that can contain the die ("smallest die-containing rectangular solid" or "SDCRS"); thus, the largest side of such non-rectangular-solid die is a side of its SDCRS having a surface area at least as large as each other side of the SDCRS.

In the specific example shown in FIGS. 3A and 3B, the example MOMD package 110 includes (a) two high-performance dies 102 mounted as HMDs 110: a FGPA die 110a and a GPU die 110b, and (b) four non-high performance dies 102 mounted as VMDs 112: a non-volatile memory die 112a, a DRAM die 112b, an input/output device die 112c, and a high voltage/analog device die 112d. However, the embodiment shown in FIGS. 3A and 3B is only one example; MOMD packages according to the present invention may include any number and types of HMD(s) and VMD(s). In some embodiments, VMDs 112 may be formed with a rectangular shape that is elongated in a first horizontal direction as compared with a second horizontal direction orthogonal to the first horizontal direction (e.g., by a factor of at least 2, at least 3, at least 4, at least 5, or greater than 5), e.g., to provide additional area for contact pads and/or to reduce communication latency to high-performance HMD(s) 110. VMDs 112 may be mounted or inserted manually, or automated by robot pick and place, depending on the embodiment.

The various dies 102 mounted on the horizontally-extending die mount base 104 may be connected to each other by conductive interconnects (shown in FIG. 4 discussed below) formed in the horizontally-extending die mount base 104, connected to the package substrate 106 by wire bond connections 120, and further connected to an underlying PCB (or other device to which the package 100 is mounted) by conductors 122 extending vertically through the package substrate 106.

Figure 4:
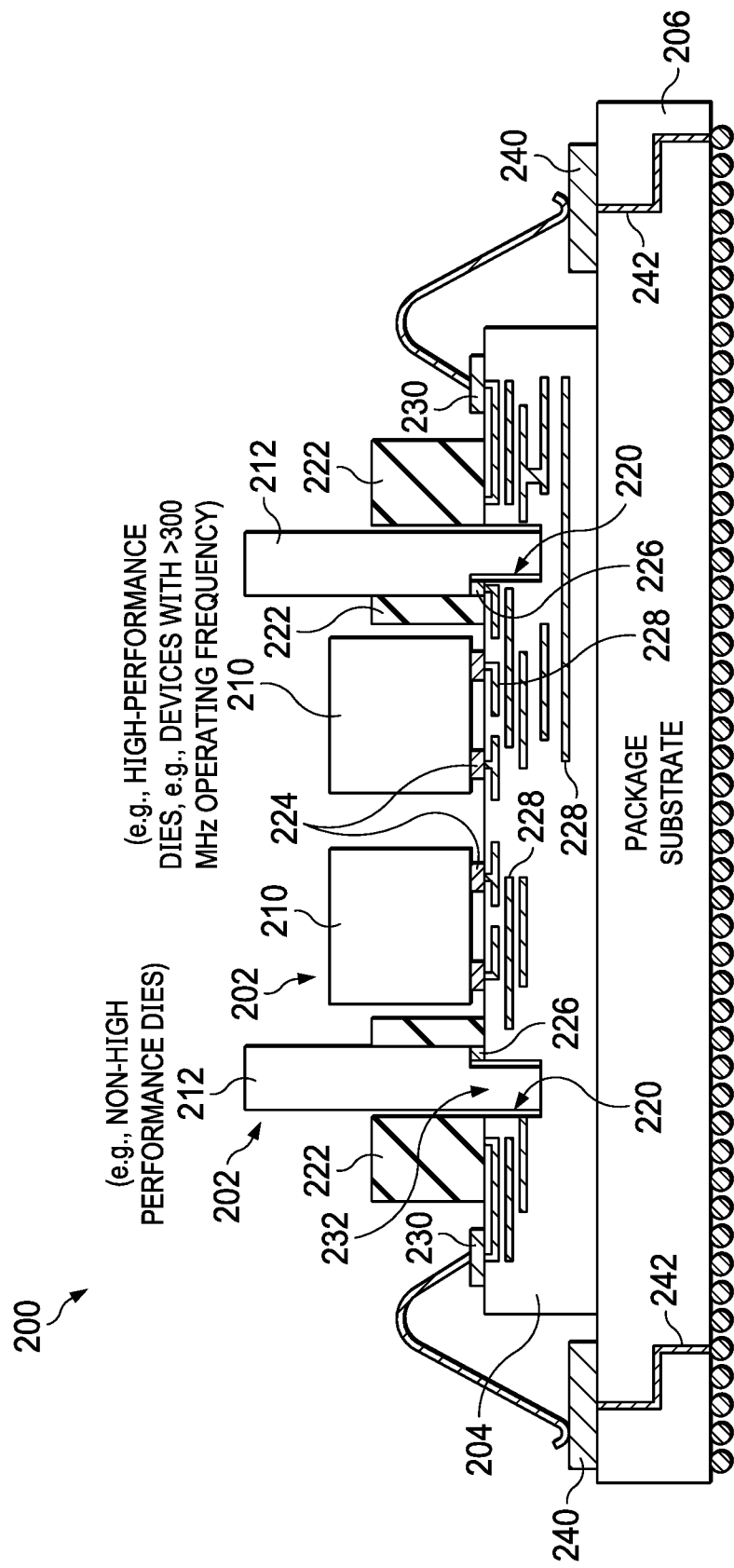
FIG. 4 is a side cross-sectional view an example MOMD package, according to one example embodiment.

FIG. 4 is a side cross-sectional view an example MOMD package 200, according to one example embodiment. As shown, MOMD package 200 includes a plurality of dies 202 mounted on a on a horizontally-extending die mount base 204, which is in turn mounted on a package substrate 206. The plurality of dies 202 mounted on the horizontally-extending die mount base 204 include both (a) horizontally-mounted dies (HMDs) 210 and vertically-mounted dies (VMDs) 212. In particular, the cross-section shown in FIG. 4 shows a pair of HMDs 210 and a pair of VMDs 212.

MOMD package 200 may include any number and types of dies 202, each arranged either horizontally as an HMD 210 or vertically as a VMD 212. For example, in some embodiments, MOMD package 200 includes at least one high-performance die mounted to the horizontally-extending die mount base 204 as an HMD 210 and at least one non-high-performance die mounted to the horizontally-extending die mount base 204 as a VMD 212. In some embodiments, each HMD 210 in MOMD package 200 is a high-performance die and each VMD 212 in MOMD package 200 is a non-high-performance die. For example, in one embodiment MOMD package 200 includes (a) a high-performance FPGA die and a high-performance GPU die, each mounted horizontally as HMDs 210, and (b) a number of other dies, e.g., non-high-performance dies, mounted horizontally as VMDs 212.

As shown in FIG. 4, the horizontally-extending die mount base 204 may include vertically-extending VMD slots 220, alignment structures 222, HMD contacts 224, VMD contact(s) 226, internal die interconnects 228, wire bond pads 230, and/or any other suitable structures or features. Each vertically-extending VMD slot 220 may be shaped and sized to receive at least a portion of a respective VMD 212 mounted to the horizontally-extending die mount base 204. For example, each respective VMD slot 220 may be shaped and sized to receive a bottom portion 232 of a respective VMD 212, wherein the bottom portion 232 is the portion of the VMD 212 arranged to fit within the respective VMD slot 220. As used herein, a VMD slot 220 may comprise any slot, groove, recess, via, or opening configured to receive at least a portion of a VMD 212 mounted to an MOMD package 200. In some embodiments, VMD slots 220 may be deeper, in a vertical direction, than possible variations in the length of the VMD bottom portion 232, in the vertical direction, e.g., due to dicing variation. The number of VMD slots 220, and thus the number or VMDs 212 mounted to an MOMD package 200, may be limited only by the overall size of MOMD package 200.

In some embodiments, reclaim or test-wafer grade silicon may be used for the die mount base 204, to reduce costs. In some embodiments, copper interconnect may be used for internal die interconnects 228 formed in the die mount base 204.

Figure 5A:
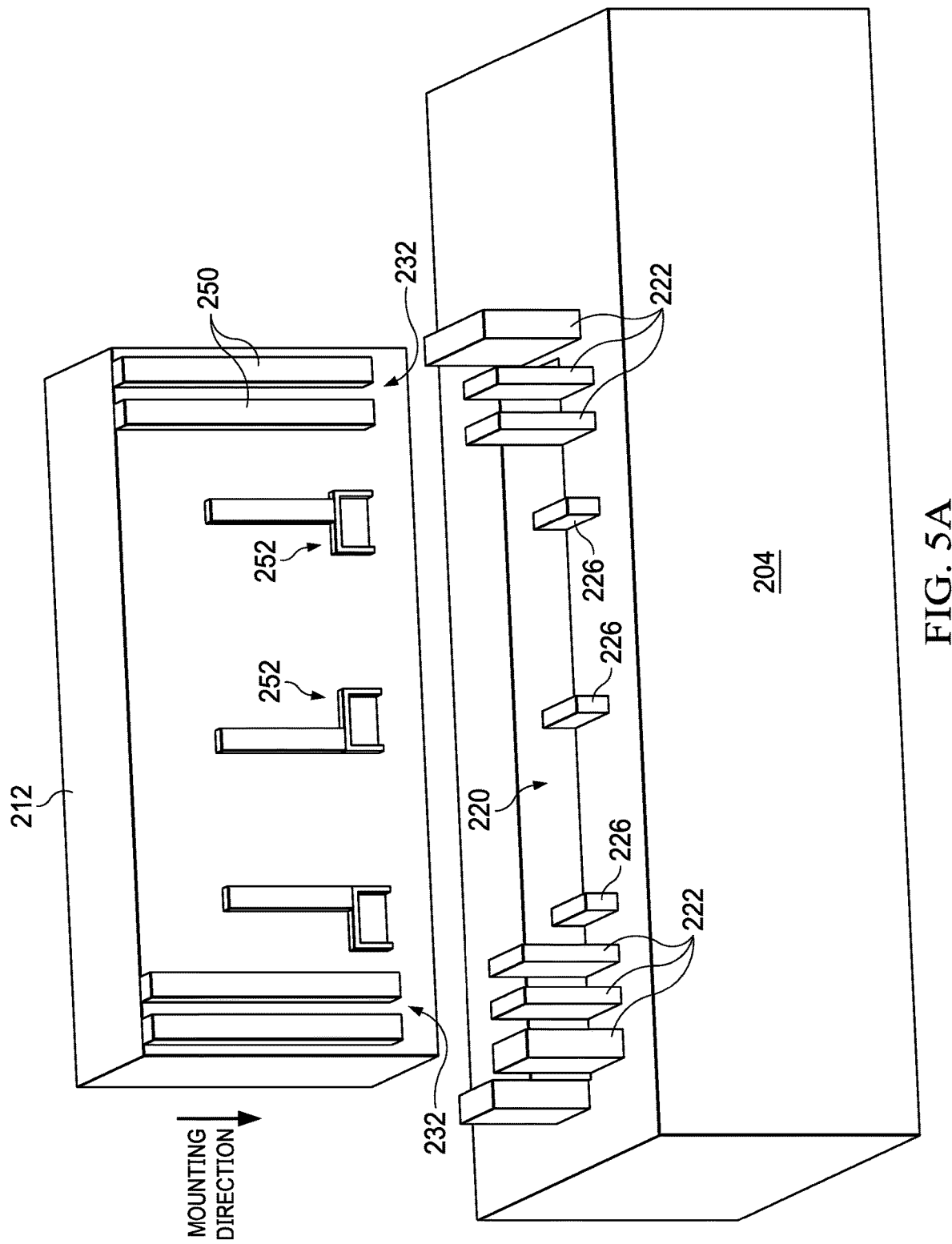
FIGS. 5A-5C illustrate an example process of mounting an example vertically-mounted die (VMD) in a vertical orientation with respect to an example MOMD die mount base, according to one example embodiment.
Figure 5B:
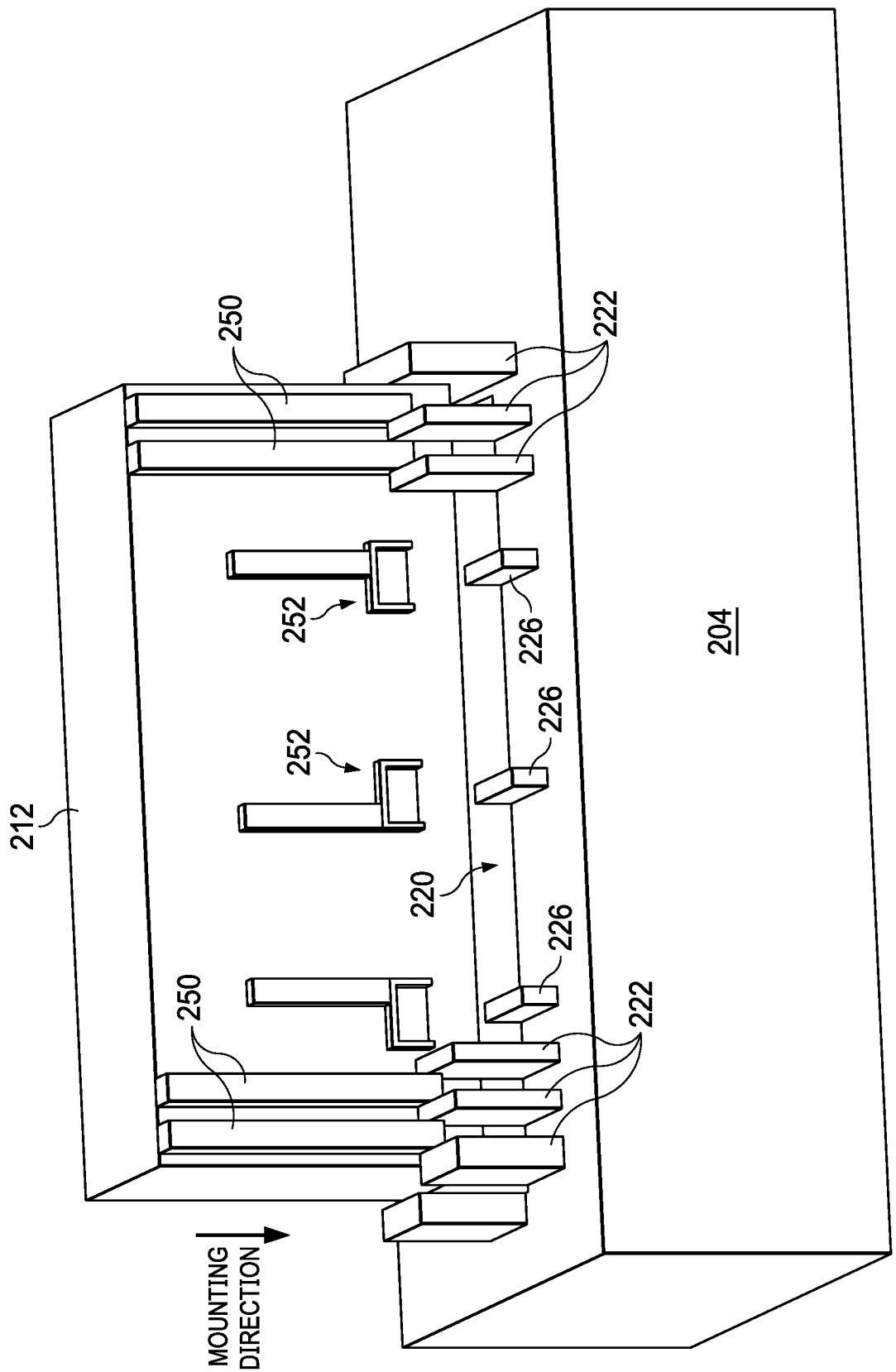
Figure 5C:
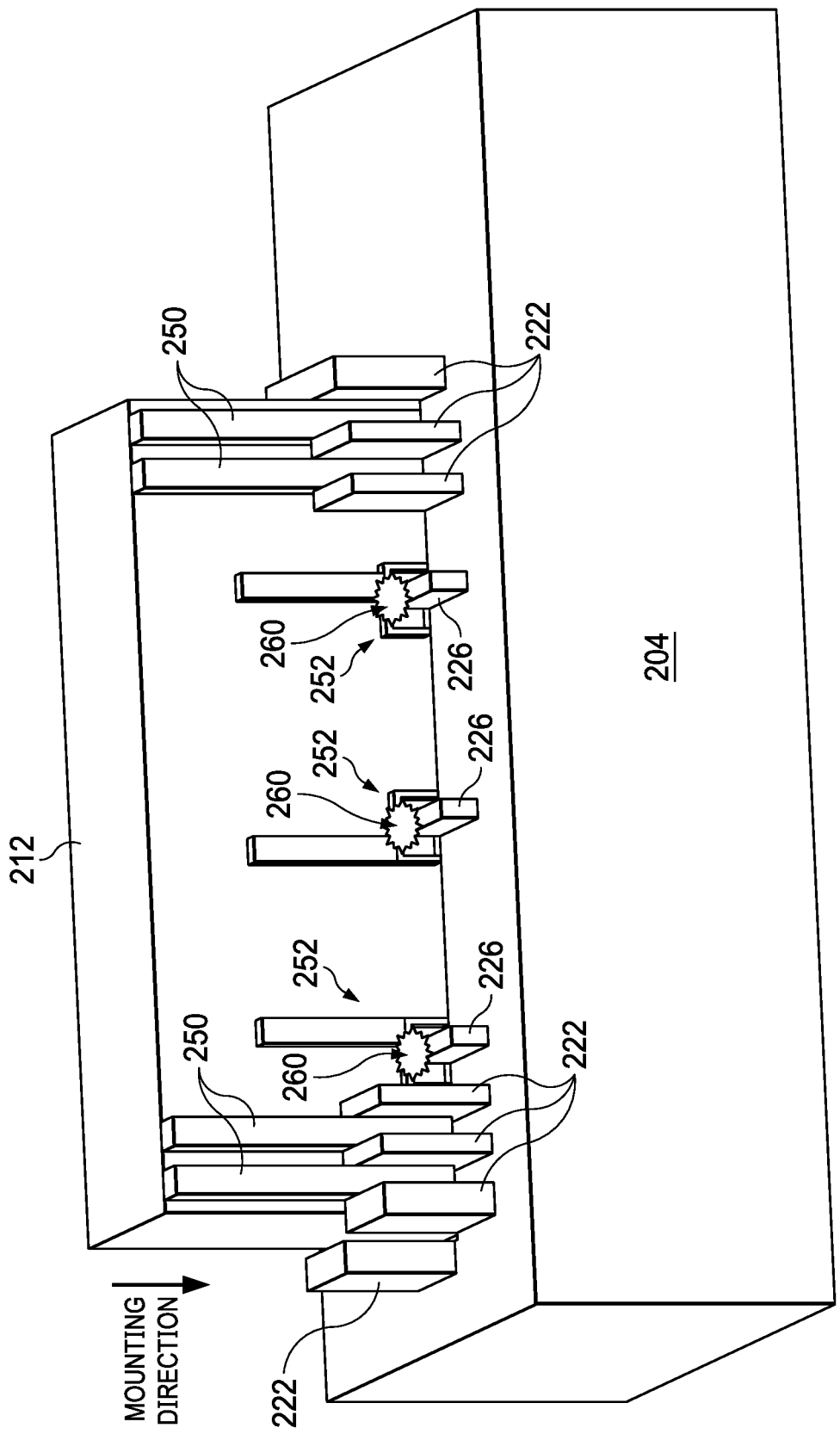

Alignment structures 222 include any structures configured to (a) align and/or guide a mounting process of a VMD 212, e.g., to align and guide an insertion of a VMD 212 into a respective vertically-extending VMD slot 220, and/or (b) provide structural support to an inserted/mounted VMD 212, and/or (c) provide heat transfer functionality for an inserted/mounted VMD 212. Alignment structures 222 may include or define plates, rails, pins, channels, slots, grooves, holes, or any other protrusions or recesses. For example, alignment structures 222 may include physical structures that protrude from a surface of the die mount base 204, e.g., structures protruding upwards from an upper or top surface of die mount base 204 (wherein this upper or top surface of die mount base 204 may be parallel to the major plane of the package substrate 206), or structures protruding laterally from a lateral sidewall of a vertically-extending VMD slot 220. In some embodiments, alignment structures 222 may be configured to interact with corresponding alignment structures provided on a VMD 212 to align and/or guide a mounting of the VMD 212 to the die mount base 204, e.g., as shown in FIGS. 5A-5C discussed below. Alignment structures 222 may be formed from any suitable material, for example, a polymer (e.g., polyimide) or other elastic or pliable material. In some embodiments, alignment structures 222 may be soft and/or sacrificial (e.g., a soft, sacrificial polymer) to help align corresponding alignment structures provided on the VMD 212 (e.g., alignment bars or rails) without damaging the die circuitry of the VMD 212.

HMD contacts 224 may include any structures configured to create a conductive contact between a mounted HMD 210 and a conductive element provided in or on the die mount base 204 (e.g., an internal die interconnect 228 or surface trace formed on die mount base 204). Similarly, VMD contacts 226 may include any structures configured to create a conductive contact between a mounted VMD 212 and a conductive element provided in or on the die mount base 204 (e.g., an internal die interconnect 228 or surface trace formed on die mount base 204). Example HMD contacts 224 and VMD contacts 226 include contact pads, contact pins/holes, and solder balls.

Internal die interconnects 228 may include any conductive lines or other elements for conductively connecting one or more dies 202 to each other, to wire bond pads 230, and/or to other conductive structures formed in, or on, the die mount base 204 or the package substrate 206 (e.g., TSVs formed in the package substrate 206). In some embodiments, internal die interconnects 228 provide the structure and function of one or more metal layers typically formed internal to a die 202 (HMD 210 or VMD 212) mounted to the die mount base 204 (e.g., one or more metal layers typically formed in an FGPA or other high-performance die), such that these layers may not need to be formed during the manufacturing of the respective die 202. Thus, the number of metal layers formed in at least one die 202 (e.g., an FPGA) during manufacturing may be reduced (i.e., replaced by the internal die interconnects 228), which may provide a significant cost savings.

As noted above and shown in FIG. 4, internal die interconnects 228 may be connected to wire bond pads 230 on the die mount base 204, which may be wire bonded to corresponding wire bond pads 240 formed on the package substrate 206, which in turn may be connected to TSVs or other conductive lines 242 passing vertically through the package substrate 206, to thereby provide conductive paths between dies 202 mounted on MOMD package 200 and a PCB to which the MOMD package 200 is mounted.

FIGS. 5A-5C illustrate an example process of mounting an example VMD 212 in a vertical orientation with respect to an example die mount base 204, according to one example embodiment. In some embodiments, the VMD mounting process may be aligned and/or guided by alignment structures 222 provided on the die mount base 204, which may interact with one or more structures of the VMD 212. In some embodiments, e.g., as shown in FIGS. 5A-5C, the VMD 212 may include alignment structures 250 configured to interact with alignment structures 222 provided on the die mount base 204 to align and/or guide the mounting of VMD 212, e.g., to align and guide a bottom portion 232 of VMD 212 (see FIG. 5A) into VMD slot 220 formed in the die mount base 204.

Like alignment structures 222, alignment structures 250 of VMD 212 may include or define plates, rails, pins, channels, slots, grooves, holes, or any other protrusions or recesses. For example, alignment structures 250 may include protrusions configured to be received or guided within corresponding slots, channels, grooves, or other recesses defined by alignment structures 222 of the die mount base 204; alternatively, alignment structures 222 of the die mount base 204 may include protrusions configured to be received or guided within corresponding slots, channels, grooves, or other recesses defined by alignment structures 250 of VMD 212. In the particular example shown in FIGS. 5A-5C, alignment structures 222 and alignment structures 250 each include guide plates or rails that define slots or channels configured to receive or guide the guide plates or rails of the other component (i.e., VMD 212 or die mount base 204). For example, as shown in FIGS. 5B and 5C, alignment structures 250 of VMD include pairs of guide rails that define a slot between each pair of guide rails, wherein the slot defined by each pairs of guide rails 250 is configured to receive and guide a corresponding guide plate 222 protruding from the top of the die mount base 204. In some embodiments, alignment structures 222 and/or alignment structures 250 (e.g., rails or bars) may allow for both physical alignment and optical alignment of the VMD 212 to the die mount base 204.

VMD 212 may include contacts 252 configured to engage with VMD contacts 226 to provide conductive connections between VMD 212 and die mount base 204. In the illustrated example, contacts 252 have a U-shaped or cup-shaped design configured to receive VMD contacts 226 to ensure an effective connection.

As shown in FIGS. 5A and 5B, the VMD 212 may be moved toward the die mount base 204 in the indicated mounting direction, into a position in which alignment structures 250 and engaged with alignment structures 222 for aligning or guiding the further movement of VMD toward the die mount base 204. As shown, the respective structures may be designed such that the alignment structures 250 make contact with the alignment structures 222 before the conductive contacts 252 come into contact with the VMD contacts 226, e.g., to prevent damage of the respective contacts.

As shown in FIGS. 5B and 5C, the VMD 212 may be moved further in the mounting direction, aligned or guided by alignment structures 250 and 222, until a bottom portion 232 of VMD 212 is received in the VMD slot 220 in the die mount base 204, and further until contacts 252 provided on VMD 212 engage with VMD contacts 226 provided on die mount base 204. The connections between contacts 252 and VMD contacts 226 may be soldered. In some embodiments, VMD contacts 226 (or contacts 252) may be pre-coated with solder material, such that after mounting the VMD 212 as shown in FIGS. 5A-5C, a heating process may be performed to solder contacts 252 to VMD contacts 226 (thereby soldering the VMD 212 to die mount base 204).

Figure 6A:
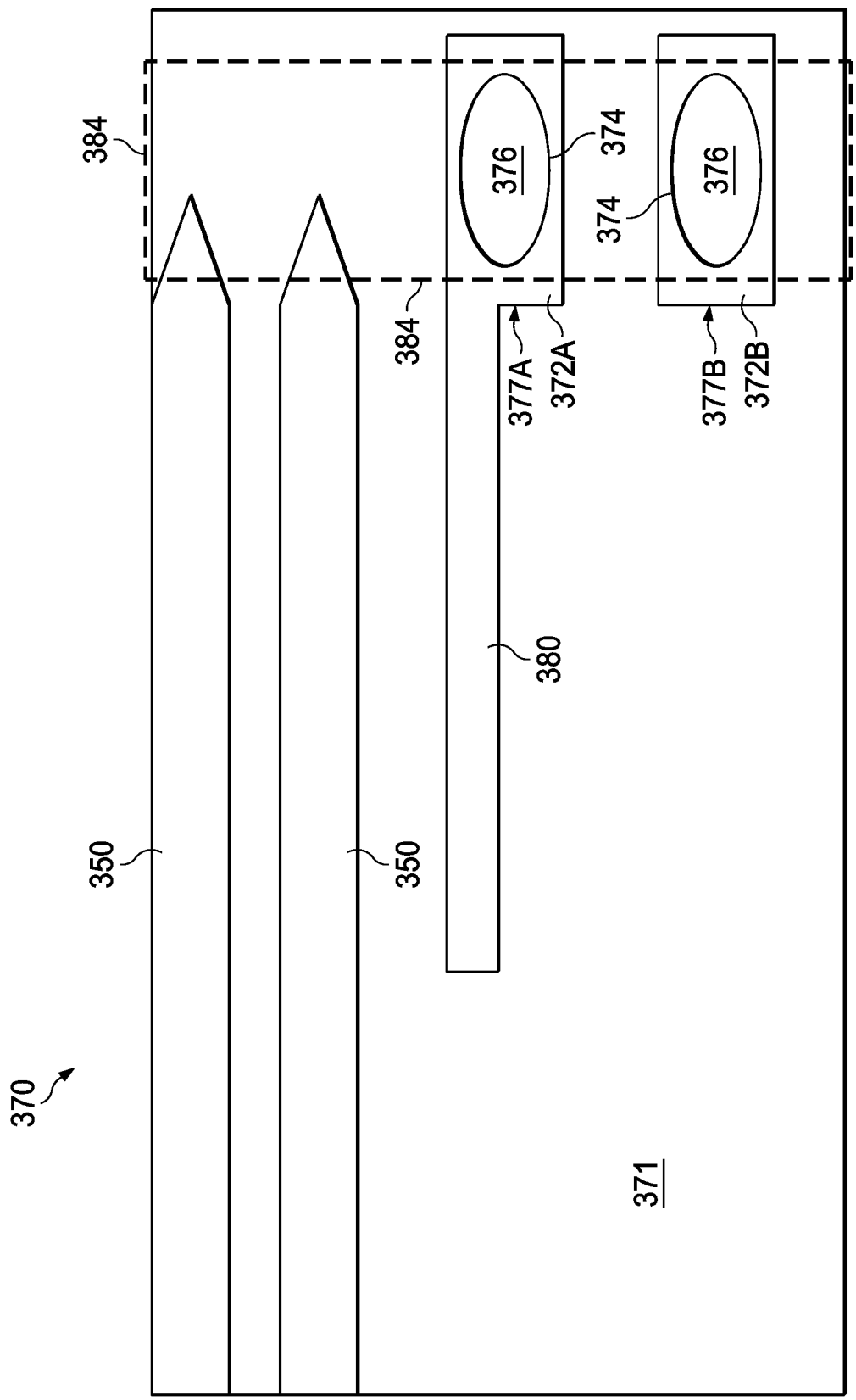
FIGS. 6A-6G are a series of side views illustrating an example process of forming an example VMD and mounting the VMD to a MOMD die mount base, according to one example embodiment.
Figure 6B:
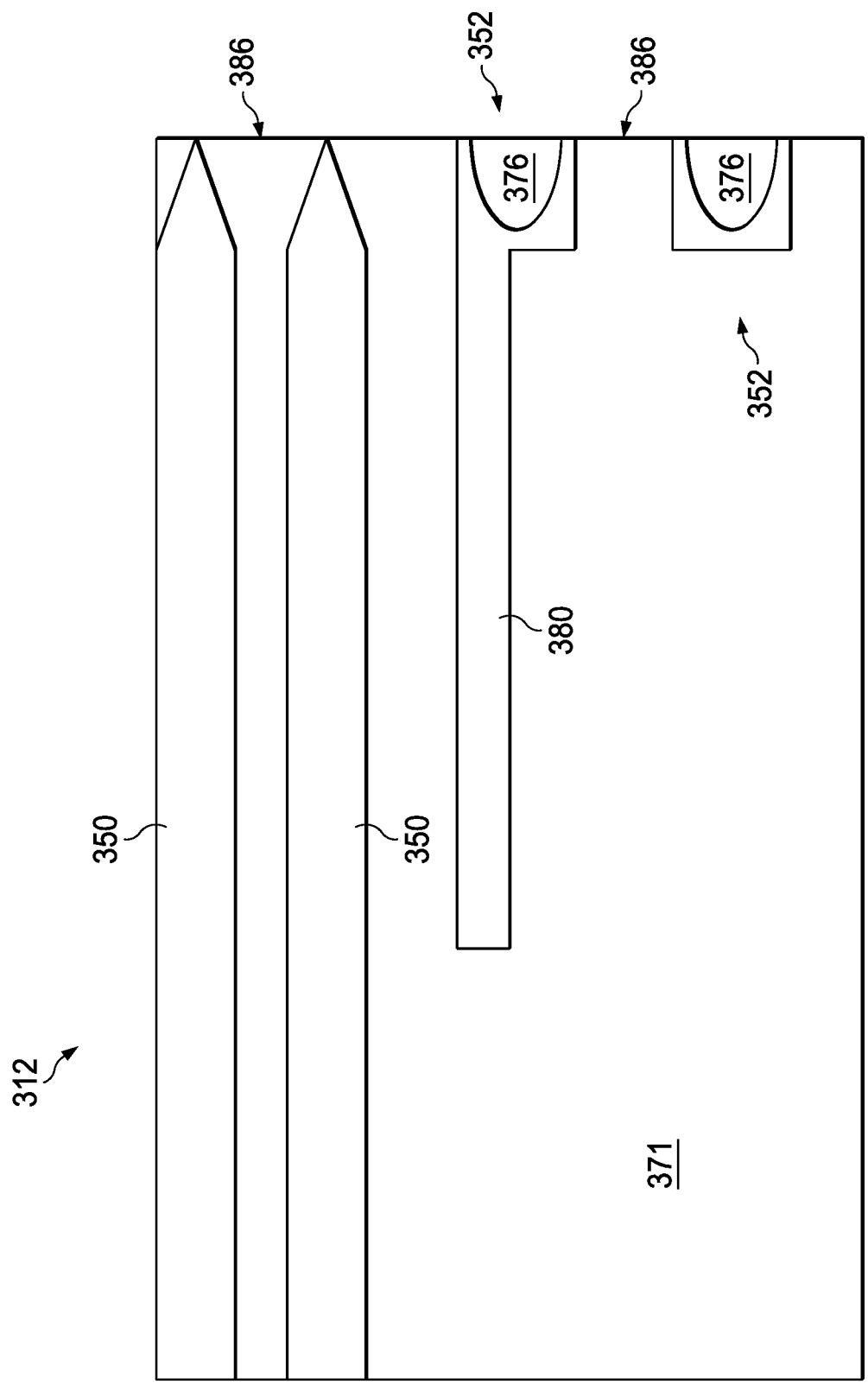

FIGS. 6A-6G are a series of side views illustrating an example process of forming an example VMD and mounting the example VMD to a die mount base 304, from a side view perspective, according to one example embodiment. FIG. 6A illustrates a VMD structure 370 prior to a die cut process (e.g., laser scribe or saw dicing), FIG. 6B illustrates the VMD structure 370 after the die cut process, thereby defining a VMD 312, and FIGS. 6C-6G illustrate a process of the VMD 312 being mounted to a die mount base 304.

Referring first to FIG. 6A, a VMD structure 370 is formed with a pair of alignment guide plates or rails 350 and a pair of contact structures 372A, 372B projecting outwardly from an outer front surface 371 of VMD structure 370 (e.g., similar to alignment structures 250 and contacts 260 projecting from front surface of VMD 212 shown in FIGS. 5A-5C). In some embodiments, alignment guide plates/rails 350 may be positioned relative to a scribe region/scribe line, indicated at 384, such that a cutting of the VMD structure 370 with the scribe region 384 (wherein the width of the cut is smaller than the scribe region 384, and thus removes only a portion of the scribe region 384) a tapered or angled end region of each alignment guide plate/rail 350 may coincide with a leading edge 386 of the resulting VMD 312, e.g., as shown in FIG. 6B.

Figure 6C:
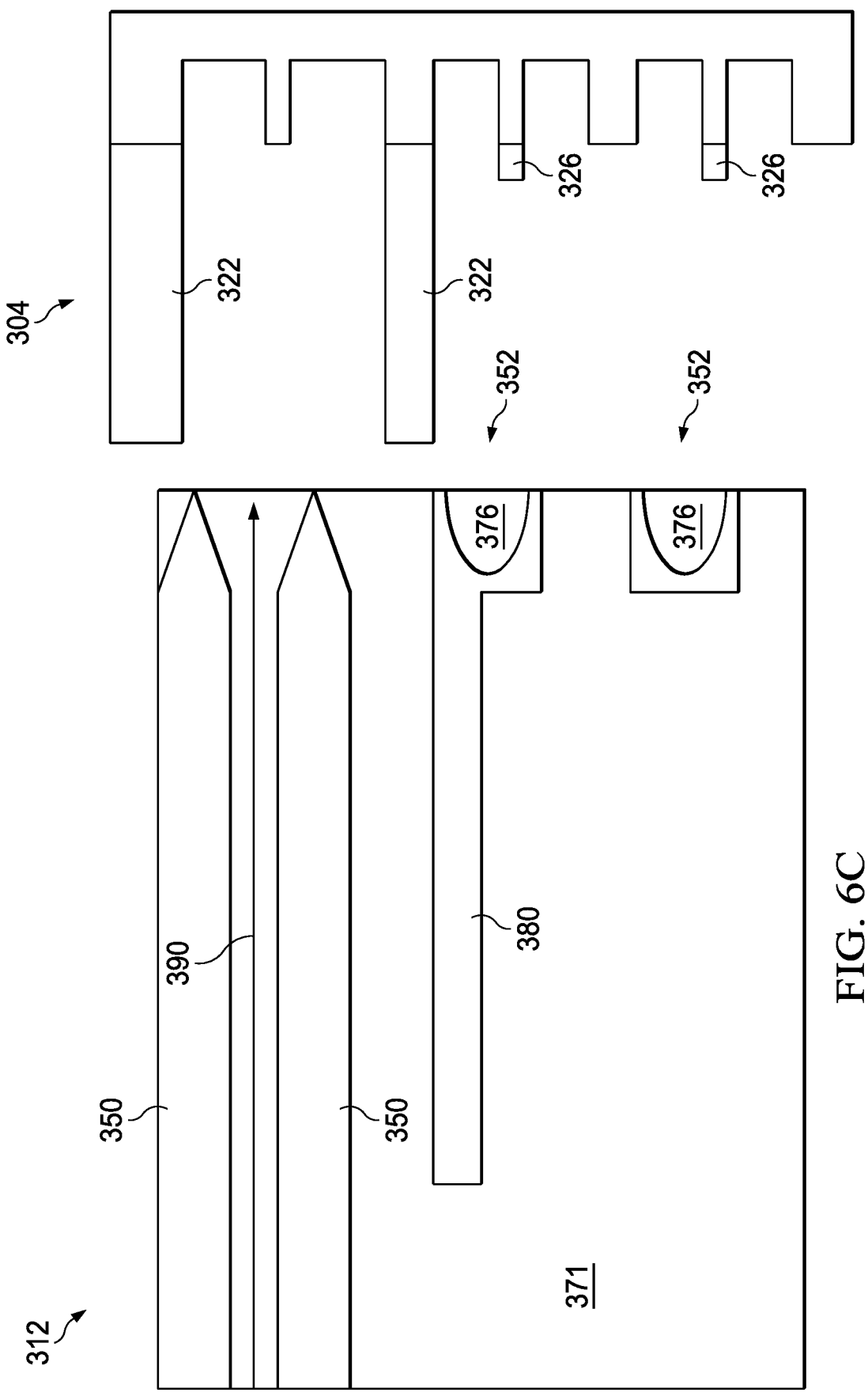
Figure 6D:
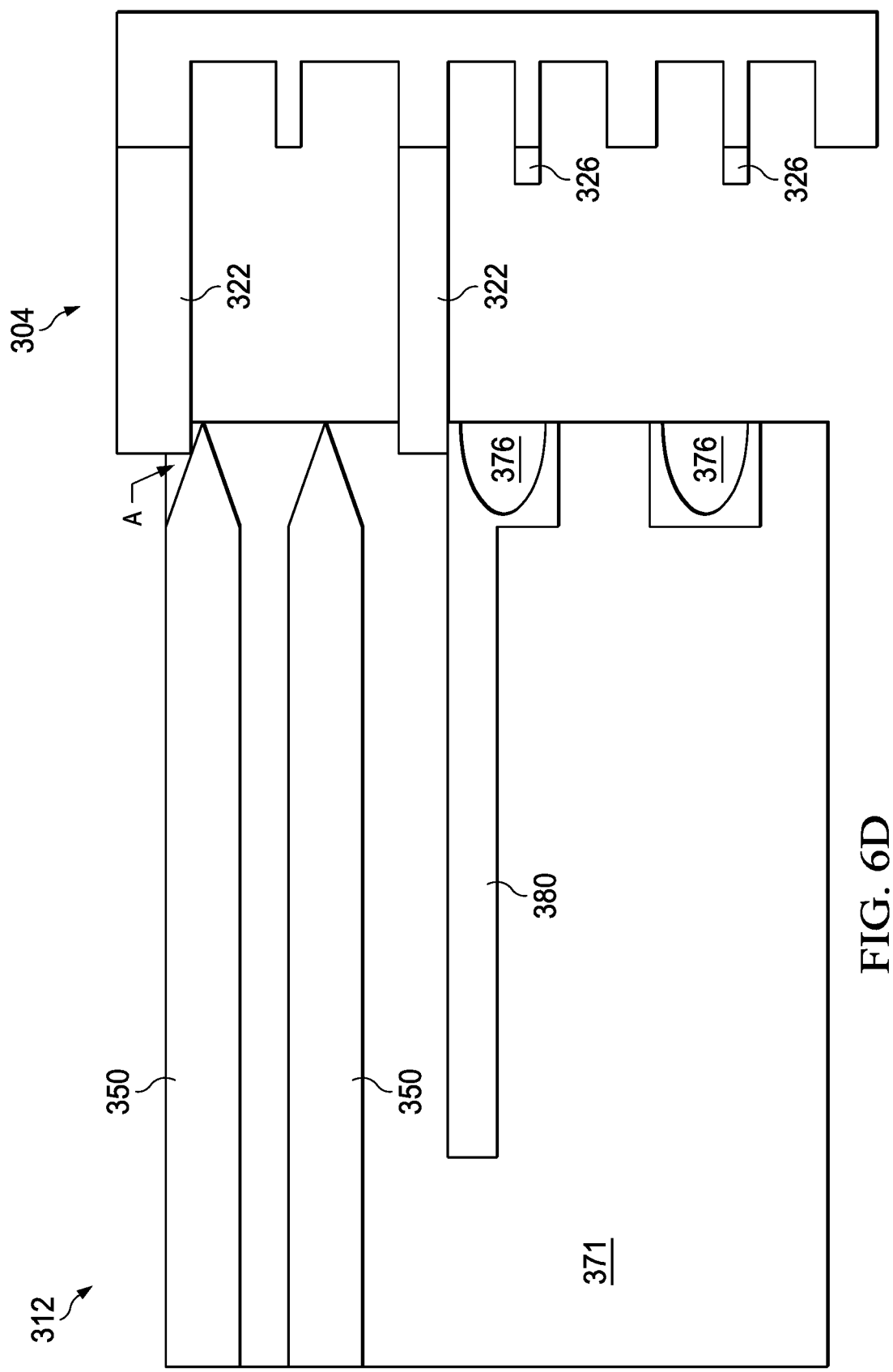
Figure 6E:
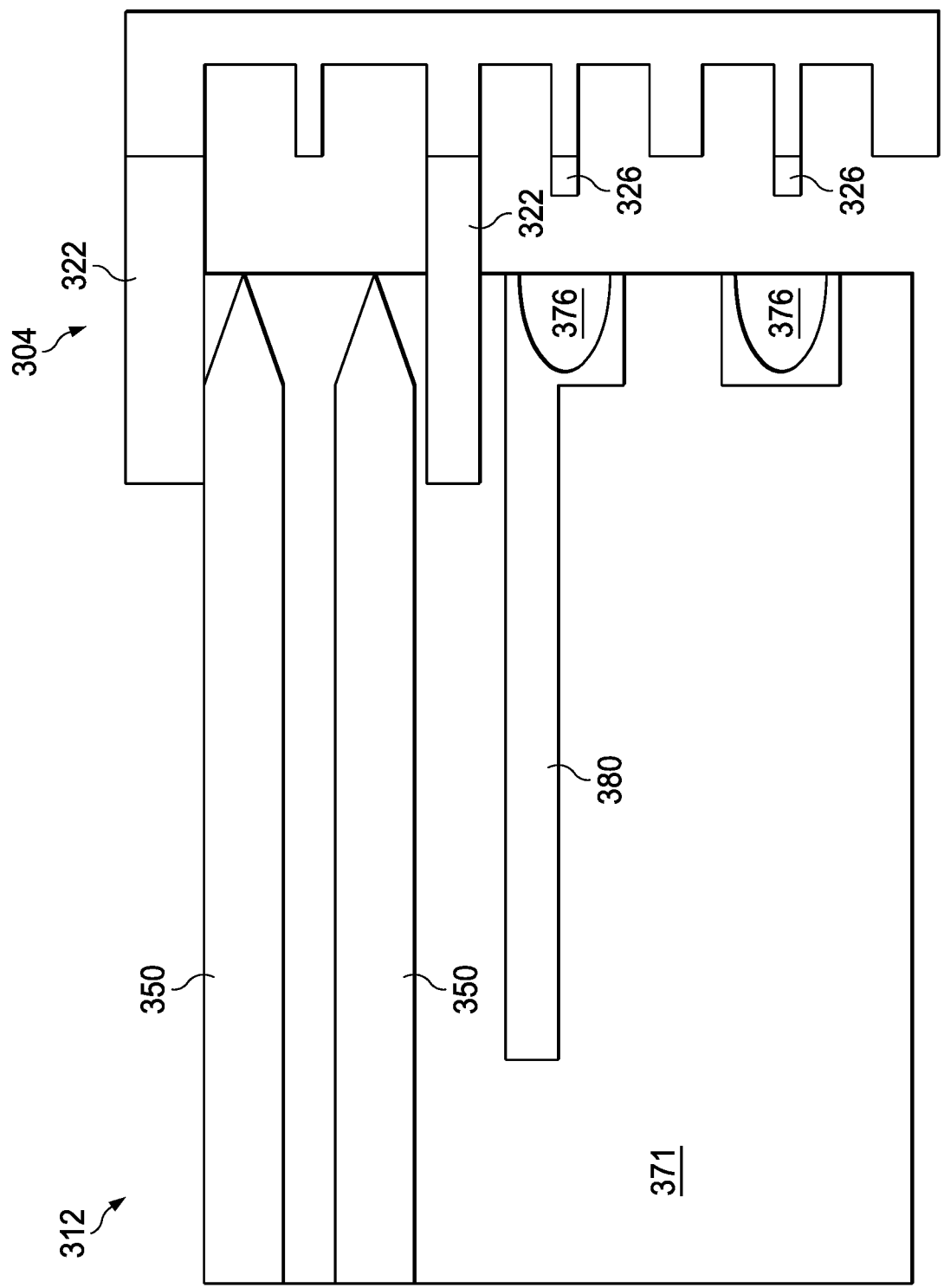
Figure 6F:
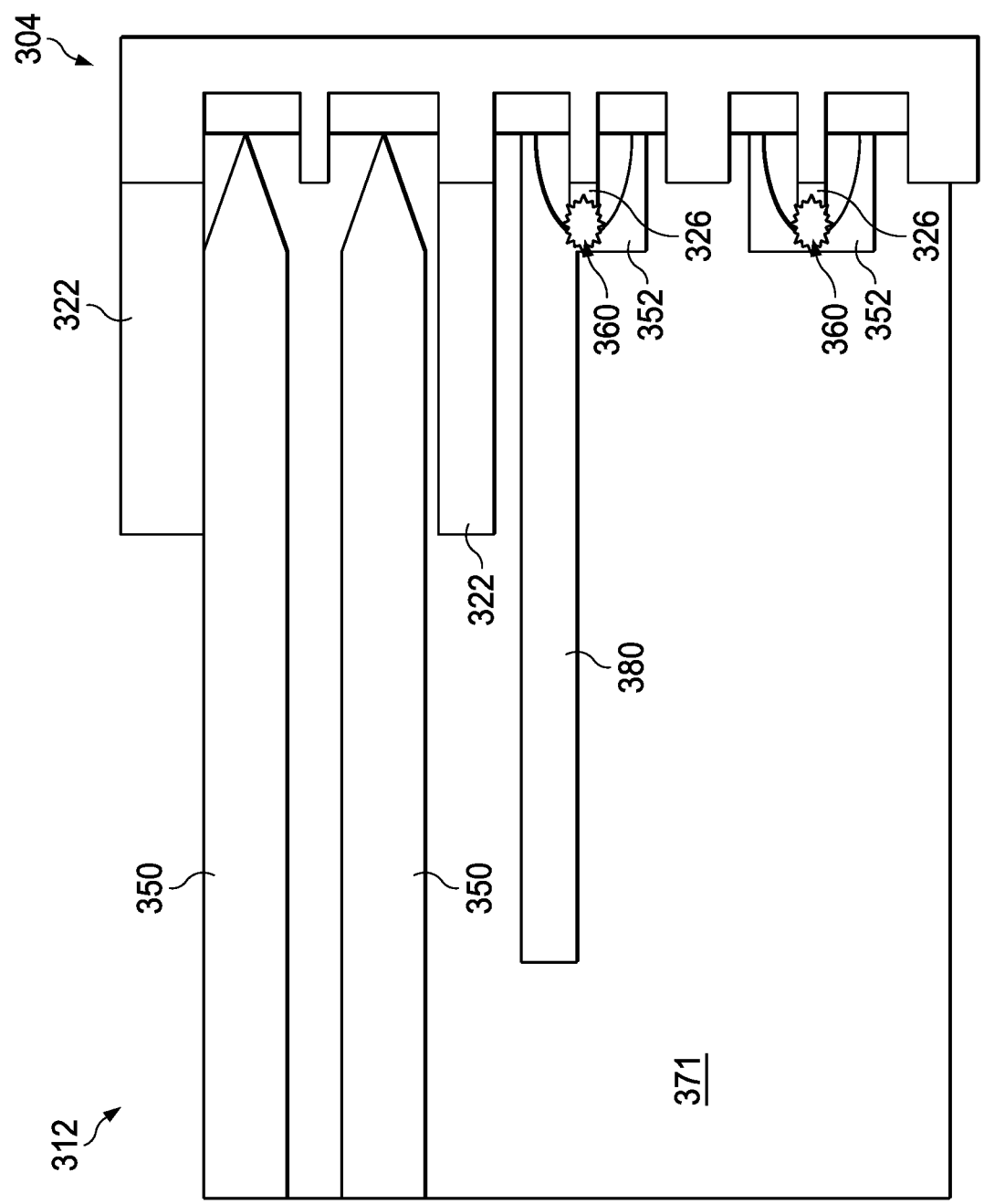
Figure 6G:
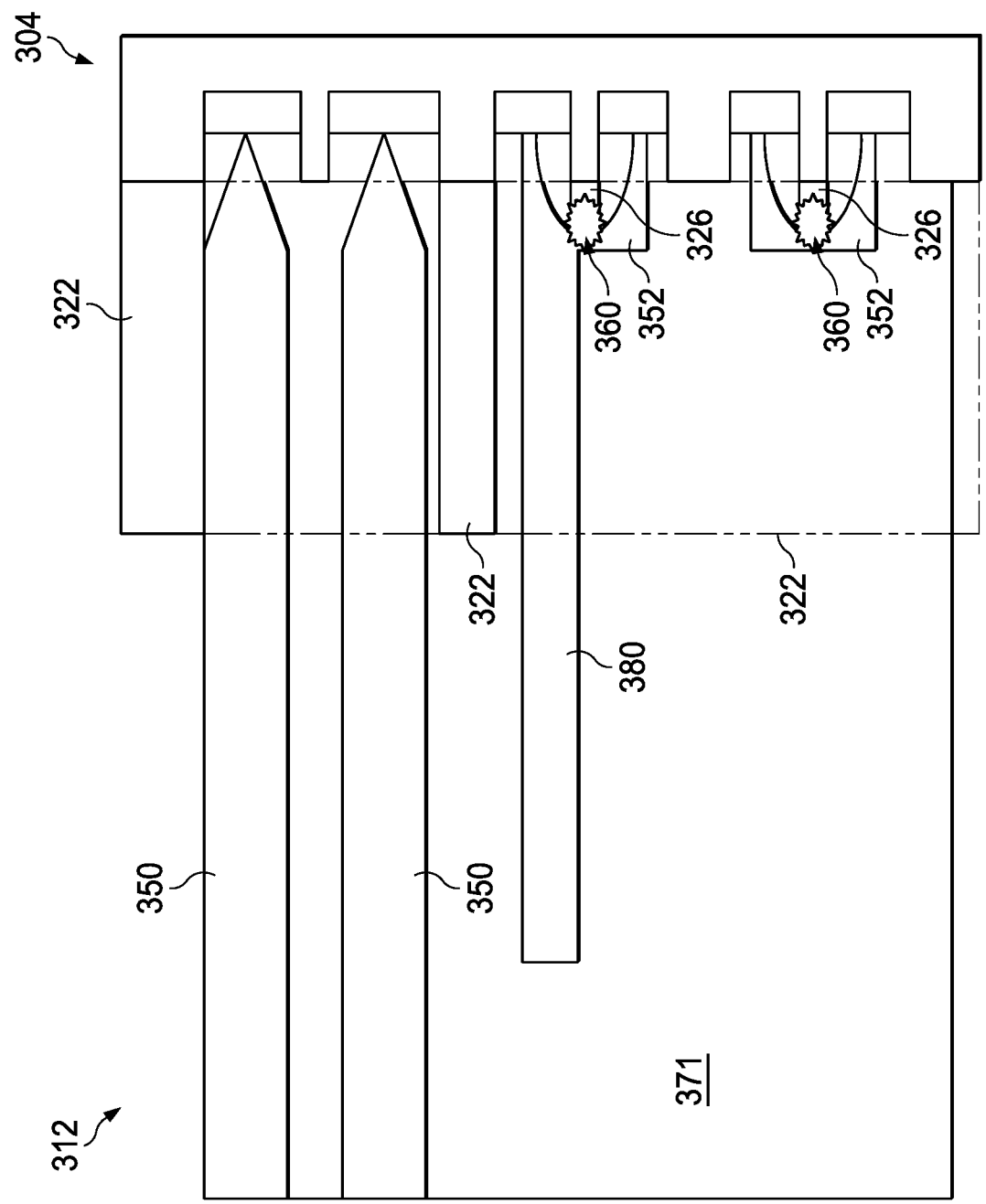

Contact structures 372A and 372B may be connected to wiring or other conductive elements of the VMD structure 370, and may be configured to engage with corresponding VMD contacts provided on a die mount base 304 of a MOMD package, e.g., as shown in FIGS. 6F-6G discussed below. In the example shown in FIG. 6A, contact structure 372A is connected to a wire 380 formed on the outer side of the VMD structure 370, while contact 372B may be connected to wiring formed within the interior of VMD structure 370 (and thus hidden from the side view of FIG. 6A). Contact structures 372A and 372B may be formed from any suitable conductive material, e.g., aluminum, copper, or tungsten. As shown, a recess 374 may be formed in each contact structure 372A and 372B in a direction extending into the page, and terminating at a bottom surface 376 recessed (in the direction extending into the page) from the surrounding front surfaces 377A and 377B of contact structures 372A and 372B. In some embodiments, the exposed bottom surfaces 376 may represent a lower topography layer of VMD structure 370, i.e., in the direction extending into the page, as compared with guide rails 350, wire 380.

In some embodiments, contact structures 372A and 372B may be formed at a position relative to the scribe region/scribe line 384 such that after the VMD structure 370 is cut through the scribe region 384, a leading end portion of each contact structure 372A and 372B forms a respective contact 352 having a U-shape, cup-shape, or arched shaped that opens at the leading edge 386 of the resulting VMD 312, e.g., as shown in FIG. 6B. The open-ended U-shape, cup-shape, or arched shaped of each contact 352A, 352B may be configured to receive a corresponding VMD contact upon mounting the VMD 312 to a die mounting structure 304, e.g., as shown in FIGS. 6F-6G discussed below.

As noted above, FIGS. 6C-6G show a process of mounting of the VMD 312 to an example die mount base 304. As shown in FIG. 6C, the die mount base 304 may include alignment structures 322, which may be formed from polyimide, another polymer material, or any other suitable material. Alignment structures 322 are configured to interact with alignment structures 350 on VMD 312, to align and guide the mounting of VMD 312 to die mount base 304. A space between adjacent alignment structures 350 may define an optical alignment channel 390 for visually or optically aligning the mounting of VMD 312, e.g., by visually or optically identifying specific structures of die mount base 304 through the optical alignment channel 390.

Die mount base 304 may include VMD contacts 326 configured to engage with the contacts 352 on VMD 312, to provide conductive coupling between VMD 312 and die mount base 304, e.g., for electrical communications between VMD 312 and a PCB to which the MOMD package including VMD 312 and die mount base 304 is mounted.

As shown in FIG. 6D, as the VMD 312 approaches the die mount base 304, interaction(s) between alignment structures 350 and 322 may physically align VMD 312 relative to die mount base 304, as indicated at area "A." FIG. 6E shows VMD 312 further advanced toward die mount base 304, with alignment structures 350 aligned between alignment structures 322.

As shown in FIG. 6F, VMD 312 may continue to be advanced, until contact 352 physically engage with VMD contacts 326, to define conductive connections between VMD 312 and die mount base 304. The connection between contacts 352 and VMD contacts 326 may then be soldered, as indicated at 360. In some embodiments, VMD contacts 326 (and/or contacts 352) may be pre-coated with solder material, such that after mounting the VMD 312 as shown in FIGS. 6C-6F, a heating process may be performed to solder contacts 352 to VMD contacts 326 (thereby soldering the VMD 312 to die mount base 304). As shown, the leading edge of VMD 312 may be separated (or "floating") from the bottom surface of the die mount base 304, such that the solder contact between solder contacts 352 and VMD contacts 326 is the only point of contact to ensure proper contact (e.g., accounting for manufacturing variations) and alignment of VMD 312.

In some embodiments, alignment structures 322 provided on the die mount base 304 may defined a recess in which a leading portion of the VMD 312 in received during the mounting of the VMD 312, such that the leading portion of the mounted VMD 312 is surrounded or partially surrounded by the alignment structures 322. FIG. 6G shows one example of such configuration, in which polymer alignment structures 322 surround the perimeter of the leading end of the mounted VMD 312.

Figure 7:
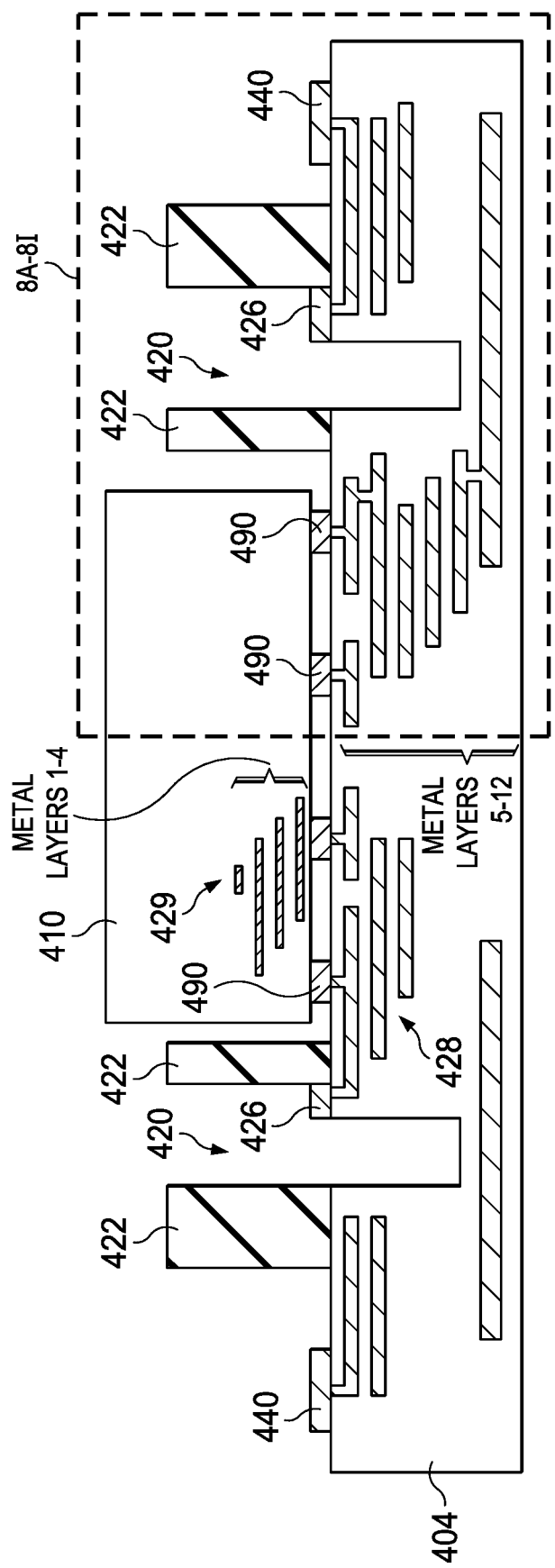
FIG. 7 illustrates a cross-section of an example die mount base of an example MOMD package, after mounting a horizontally-mounted die (HMD) but before mounting a pair of vertically-mounted dies (VMDs) to the die mount base, according to one example embodiment of the invention.

FIG. 7 illustrates a cross-section of an example horizontally-extending die mount base 404 of an example MOMD package, after mounting a HMD 410 but before mounting a pair of VMDs (not shown) to the horizontally-extending die mount base 404, according to one example embodiment of the invention. As shown, the horizontally-extending die mount base 404 may include vertically-extending VMD slots 420 for receiving portions of respective VMDs, and alignment structures 422 (e.g., polyimide structures) for aligning or guiding the mounting of VMDs in which (a) the VMDs are partially inserted into vertically-extending VMD slots 420 and (b) contacts on the VMDs are soldered to VMD contact pads 426 (e.g., aluminum-solder bond pads). VMD contact pads 426 may be arranged with any suitable pattern and density. In some embodiments, with microalignment and pad-level redistribution, VMD contact pads 426 may be provided at a density of 100 s/mm or even 1000 s/mm.

The HMD 410, e.g., a high performance FPGA, GPU, or logic chip, may be solder mounted to contact pads 490 (e.g., aluminum-solder flat micro pads) provided on the die mount base 404. The die mount base 404 may include internal die interconnects 428 that connect HMD 410 to other die(s) (e.g., VMD(s) and/or other HMD(s) mounted on the die mount base 404) and/or to other elements formed in the die mount base 404. The internal die interconnects 428 may provide the structure and function of one or more metal layers typically formed internal to HMD 410 (e.g., one or more metal layers typically formed in a high-performance FGPA, GPU, or logic chip), such that these layers may be omitted from the manufacturing of the HMD 410. Thus, the number of metal layers formed in HMD 410 during manufacturing may be reduced (replaced by the internal die interconnects 428), which may provide a significant cost savings.

In the illustrated example, HMD 410 is a type of die (e.g., FPGA) that utilizes 12 metal layers, conventionally manufactured as integral structures in the die. However, in the illustrated embodiment, internal die interconnects 428 provide the functionality of metal layers 5-12 of the 12 metal layers utilized by HMD 410, and thus only metal layers 1-4, indicated at 429, are formed within HMD 410. It may be significantly less expensive to form metal layers in the die mount base 404 as opposed to manufacturing such metal layers within HMD 410. Thus, by forming a portion of the metal layers of HMD 410 as interconnects 428 in the die mount base 404 (in this example, metal layers 5-12 of the 12 metal layers utilized by the HMD 410), the overall cost of the MOMD package may be significantly reduced.

The die mount base 404 may also include wire bond pads 440 for wire bonding the die mount base 404 to wire bond pads on a package substrate to which the die mount base 404 is mounted.

Figure 8A:
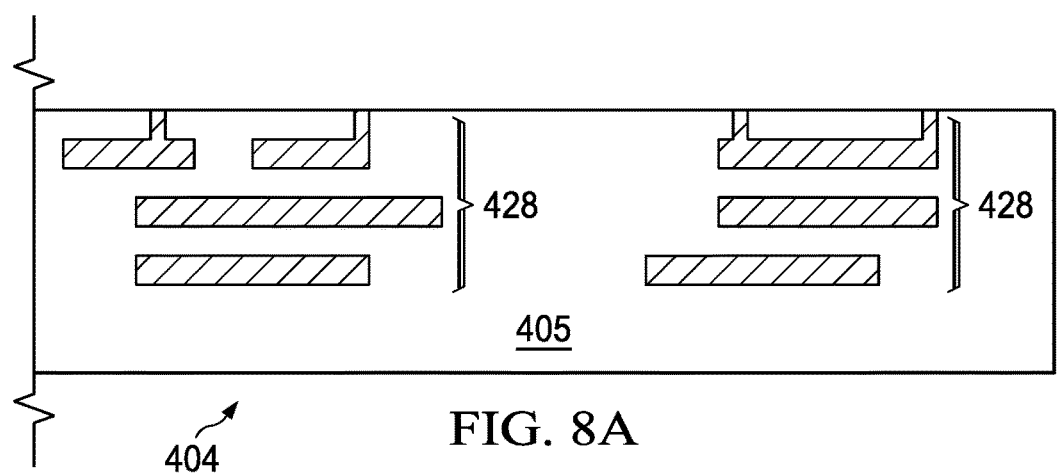
FIGS. 8A-8I are a series of cross-sectional views illustrating an example process for forming the MOMD die mount base shown in FIG. 7, according to one example embodiment.

FIGS. 8A-8I are a series of cross-sectional views illustrating an example process for forming the MOMD die mount base 404 shown in FIG. 7, according to one example embodiment. In particular, FIGS. 8A-8I are focused on the portion of the die mount base 404 indicated in FIG. 7 by the dashed boundary 8A-8I. As shown in FIG. 8A, a pattern of metal interconnects 428 may be formed in a substrate 405, e.g., using any processing techniques known in the art. Substrate 405 may be formed from any suitable material or materials, including semiconductor material(s), e.g., silicon, or non-semiconductor material(s), e.g., quartz.

Metal interconnects 428 may (a) provide metal routing for interconnecting multiple dies subsequently mounted to the die mount base 404 (e.g., one or more HMDs and/or one or more VMDs), and/or (b) provide at least a portion of the routing or functionality of metal layer(s) conventionally manufactured integrally within one or more dies, e.g., as discussed above regarding metal layer 5-12 shown in FIG. 7.

In some embodiments, substrate 405 may comprise an inexpensive reclaim silicon substrate or non-electrical grade wafer, which may reduce the total cost of the die mount base 404. Interconnects 428 may be formed from metal (e.g., copper, aluminum, or tungsten) or any other electrically conductive material.

Figure 8B:
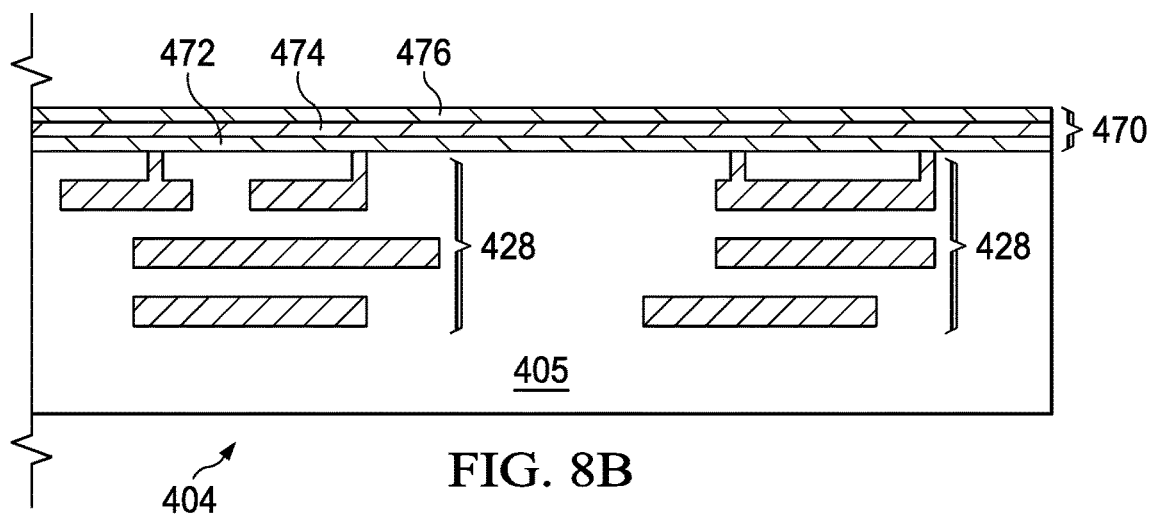

As shown in FIG. 8B, a contact layer stack 470 may be formed, e.g., by depositing a barrier metal layer (e.g., TaN, TiN, or Ta+TaN) 472, depositing an aluminum layer 474, and depositing a solder layer (e.g., tin) 476.

Figure 8C:
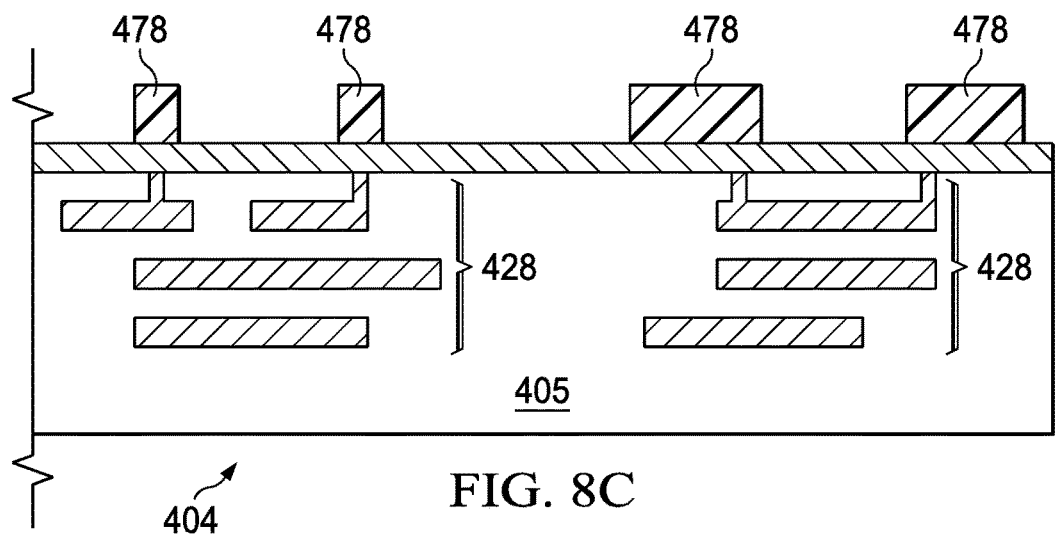

As shown in FIG. 8C, a photomask may be formed and patterned (e.g., using known techniques) to form a plurality of mask regions 478 over a number of areas on the contact layer stack 470 at which contacts are to be formed from the contact layer stack 470 (e.g., one or more HMD contacts 490, VMD contacts 426, and/or wire bond pads 440).

Figure 8D:
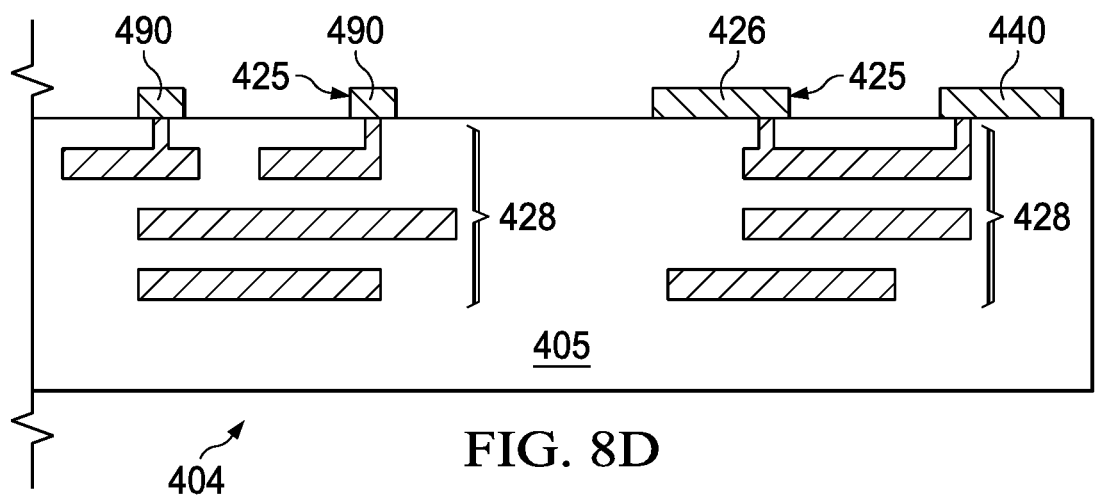

As shown in FIG. 8D, an etch and clean process is performed to remove portions of contact layer stack 470 and then mask regions 478 to define a number of conductive contacts 425, e.g., each contact 425 being an HMD contact 490 (for mounting an HMD thereto), a VMD contact 426 (for mounting a VMD thereto), or a wire bond pad 440 (for wire bonding the electronics of the die mount base 404 to an underlying package substrate to which the die mount base 404 is subsequently mounted). As shown, each conductive contact 425 contacts a selected metal interconnect 428. Each conductive contact 425 may be formed from any suitable conductive material. In one embodiments, each conductive contact 425 comprises an aluminum-solder bond pad.

Figure 8E:
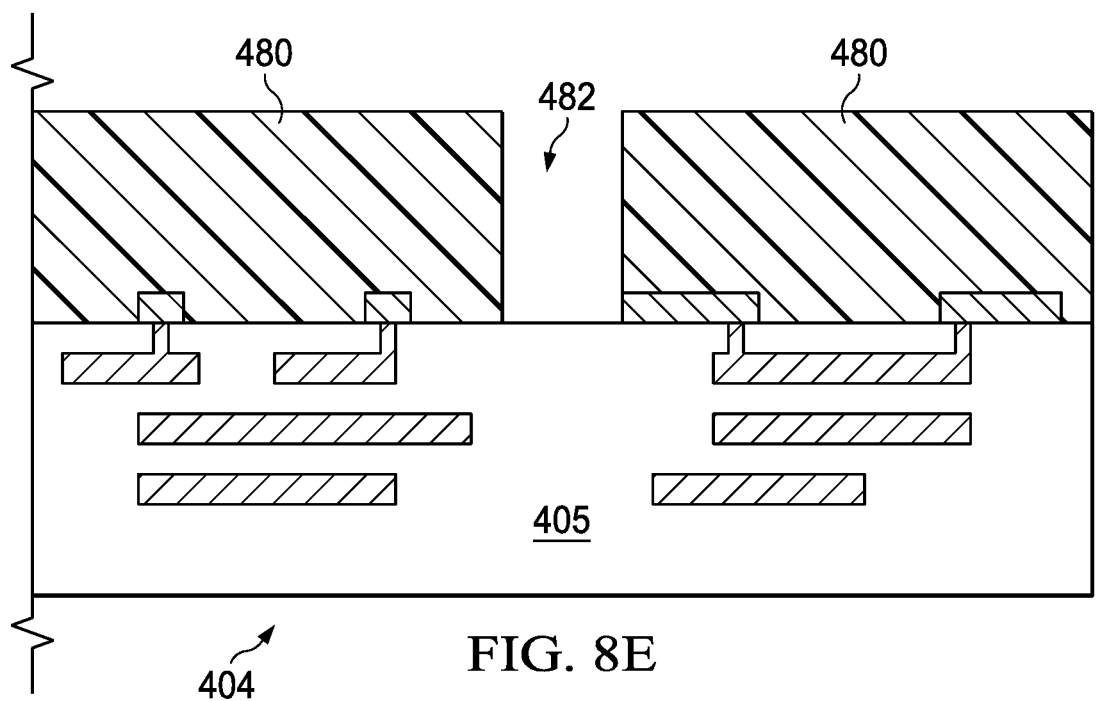

As shown in FIG. 8E, a photomask 480 is formed and patterned to form an opening 482 for etching a VMD slot in the substrate 405 for receiving a VMD mounted to the die mount base 404.

Figure 8F:
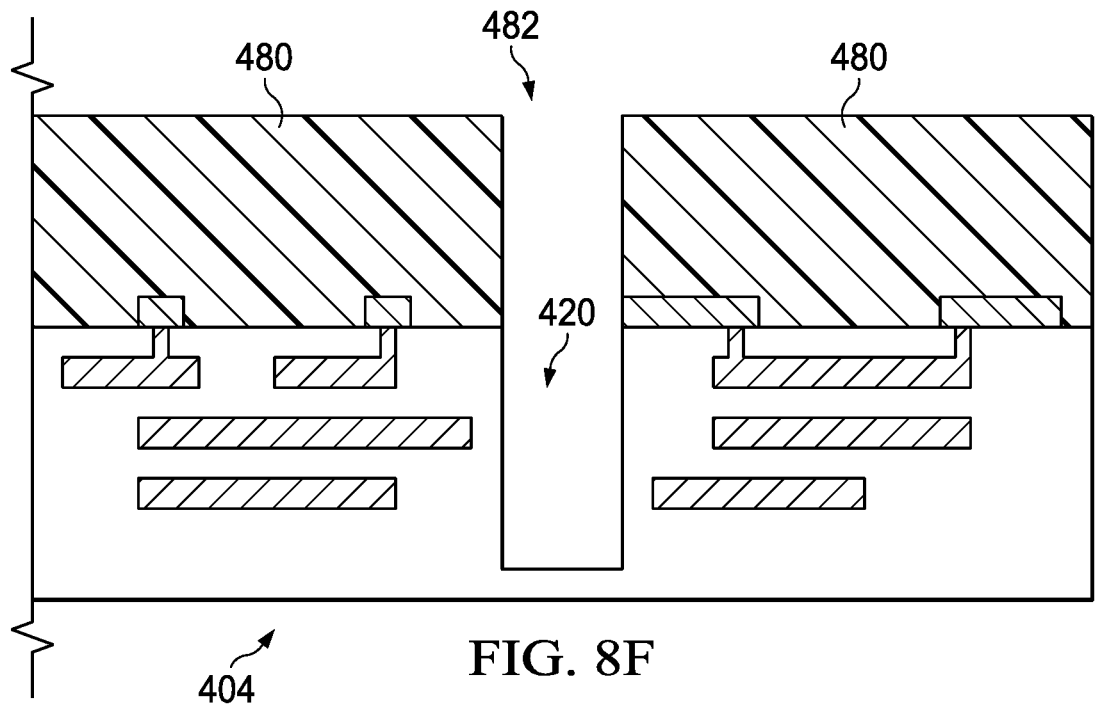
Figure 9:
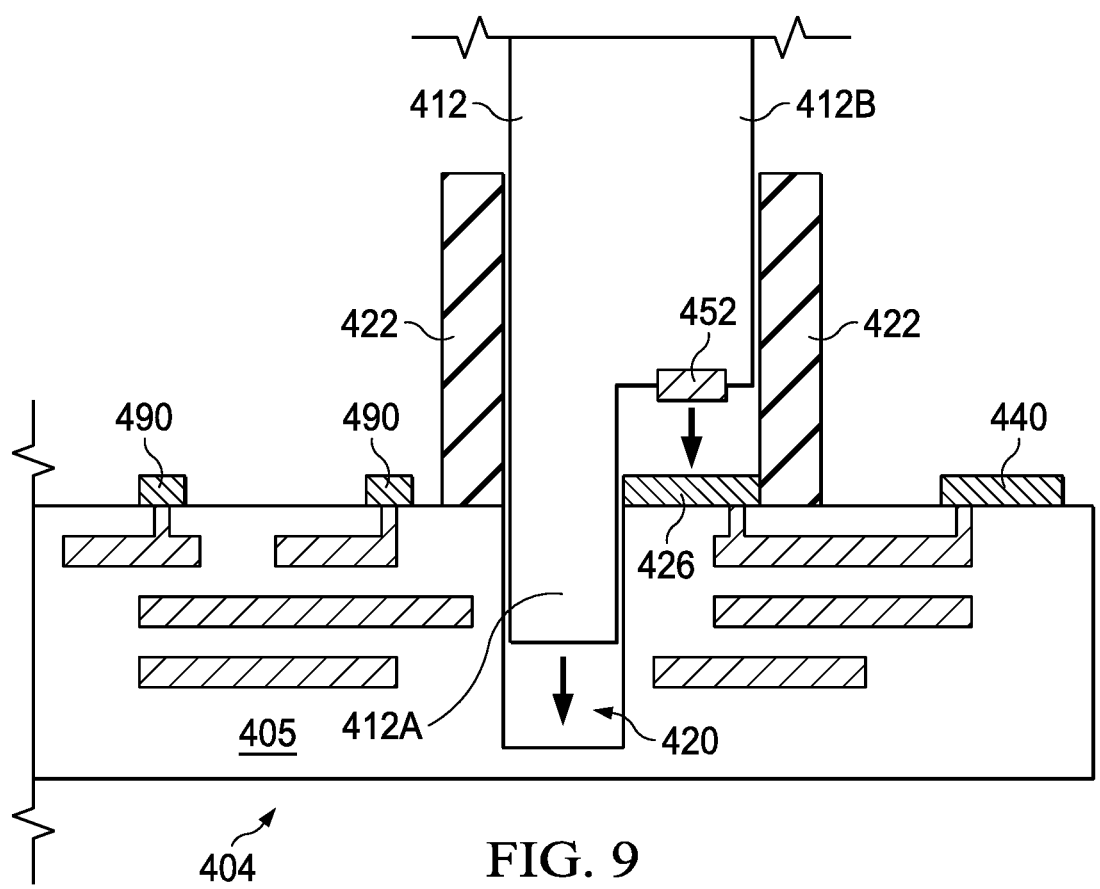
FIG. 9 is a cross-sectional view illustrating a vertical mounting of an example VMD to the example MOMD die mount base shown in FIG. 8I, according to one example embodiment.

As shown in FIG. 8F, an etch is performed through opening 482 to create a vertically-extending VMD slot 420 configured to receive a portion of a VMD mounted to the die mount base 404 (for example, as shown in FIG. 9 discussed below).

Figure 8G:
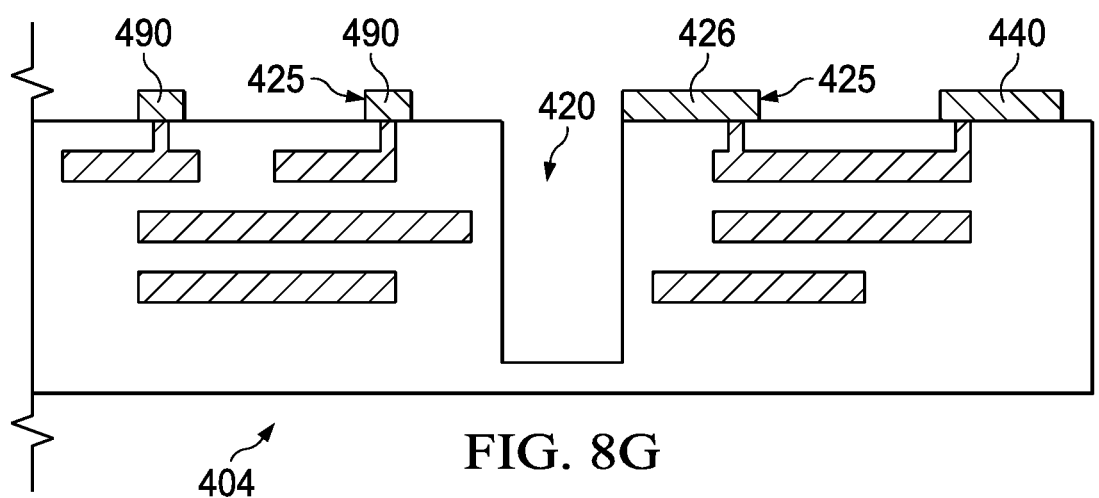

As shown in FIG. 8G, a clean process may be performed to remove remaining portions of photomask 480 from the structure of FIG. 8F now including the VMD slot 420, thus exposing the previously-formed conductive contacts 425, e.g., HMD contact(s) 490, VMD contact(s) 426, and/or wire bond pad(s) 440.

Figure 8H:
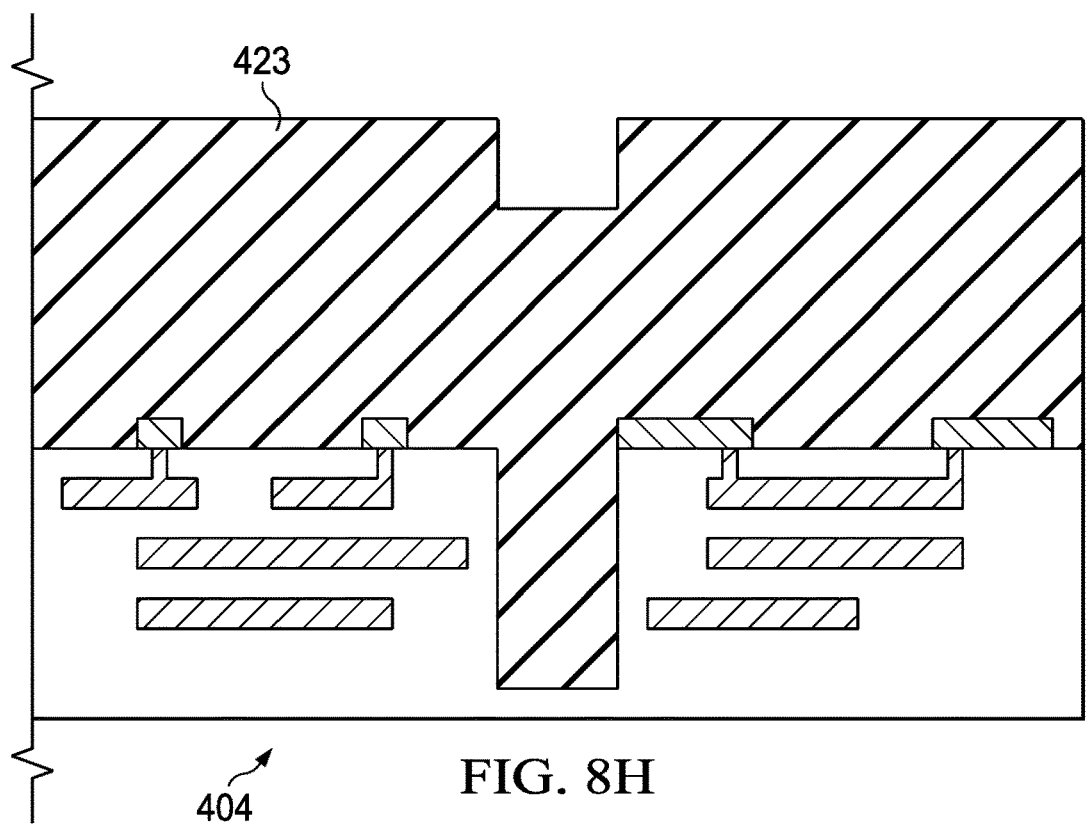

As shown in FIG. 8H, an alignment structure layer 423 is deposited over the structure. Alignment structure layer 423 may comprise any suitable material. For example, alignment structure layer 423 may comprise a flexible or malleable material, e.g., a polyimide material, or alternatively, a rigid material. In some embodiments, alignment structure layer 423 may comprise a photosensitive material, e.g., a photosensitive polyimide, as discussed below regarding FIG. 8I.

Figure 8I:
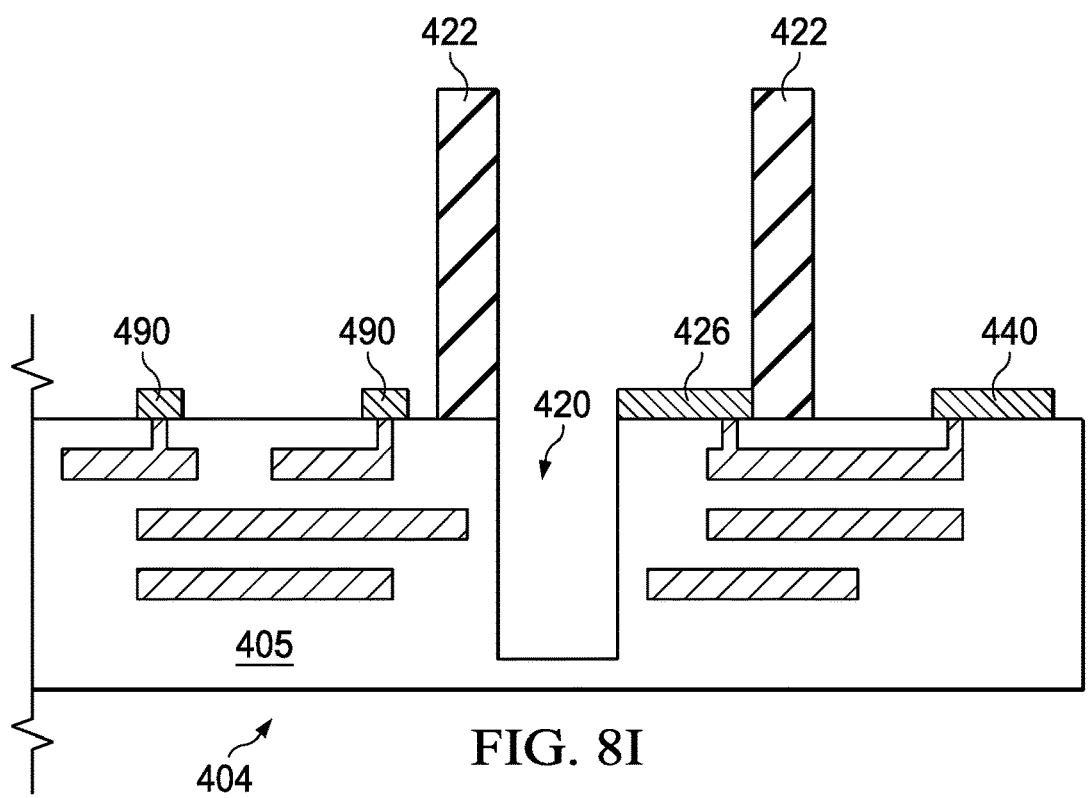

As shown in FIG. 8I, portions of the alignment structure layer 423 of FIG. 8H may be removed to define one or more alignment structures 422. In some embodiments, the portions of alignment structure layer 423 may be removed by etching or using known photolithography techniques. For example, in embodiments in which alignment structure layer 423 comprises a photosensitive material, e.g., a photosensitive polyimide, alignment structure layer 423 may be selectively exposed, developed, and cleaned to define alignment structure(s) 422.

Alignment structure(s) 422 may include any structures configured to (a) align and/or guide a mounting process of a VMD to the die mount base 404 and/or (b) provide structural support to an inserted/mounted VMD, and/or (c) provide heat transfer functionality for an inserted/mounted VMD. For example, the pair of alignment structures 422 shown in FIG. 8I may be configured to align and/or guide the mounting of a VMD in a downward direction between the pair of alignment structures 422. In some embodiments, the alignment structures 422 may guide a leading (bottom) portion of the VMD into the VMD slot 420, as shown in FIG. 9 discussed below.

FIG. 9 is a cross-sectional view illustrating a vertical mounting of an example VMD 412 to the example MOMD die mount base 404 shown in FIG. 8I, according to one example embodiment. The VMD 412 may be positioned between the pair of alignment structures 422 and moved vertically (downwardly in the orientation shown in FIG. 9). The alignment structures 422 may align and guide the vertical insertion of the VMD 412, such that a leading portion 412A of the VMD 412 is guided into the VMD slot 420 formed in the substrate 405. The VMD 412 may be inserted until one or more conductive contacts 452 on VMD 412 engage with corresponding VMD contact(s) 426. In some embodiments, VMD contact(s) 426 and/or contact(s) 452 may be pre-coated with solder material, such that after mounting the VMD 412, a heating process may be performed to solder contacts 452 to VMD contacts 426, thereby soldering the VMD 212 to the die mount base 404.

As discussed above regarding FIGS. 5A and 6A-6B, VMD contacts 426 provided on VMD 412 for conductively connecting the VMD 412 to die mount base 404 of an MOMD package may have a U-shaped, cup-shaped, or arch-shaped design configured to receive a corresponding VMD contact 426 upon mounting the VMD 412 to the die mounting structure 304, e.g., as shown in FIGS. 6A-6G discussed below.

Figure 10A:
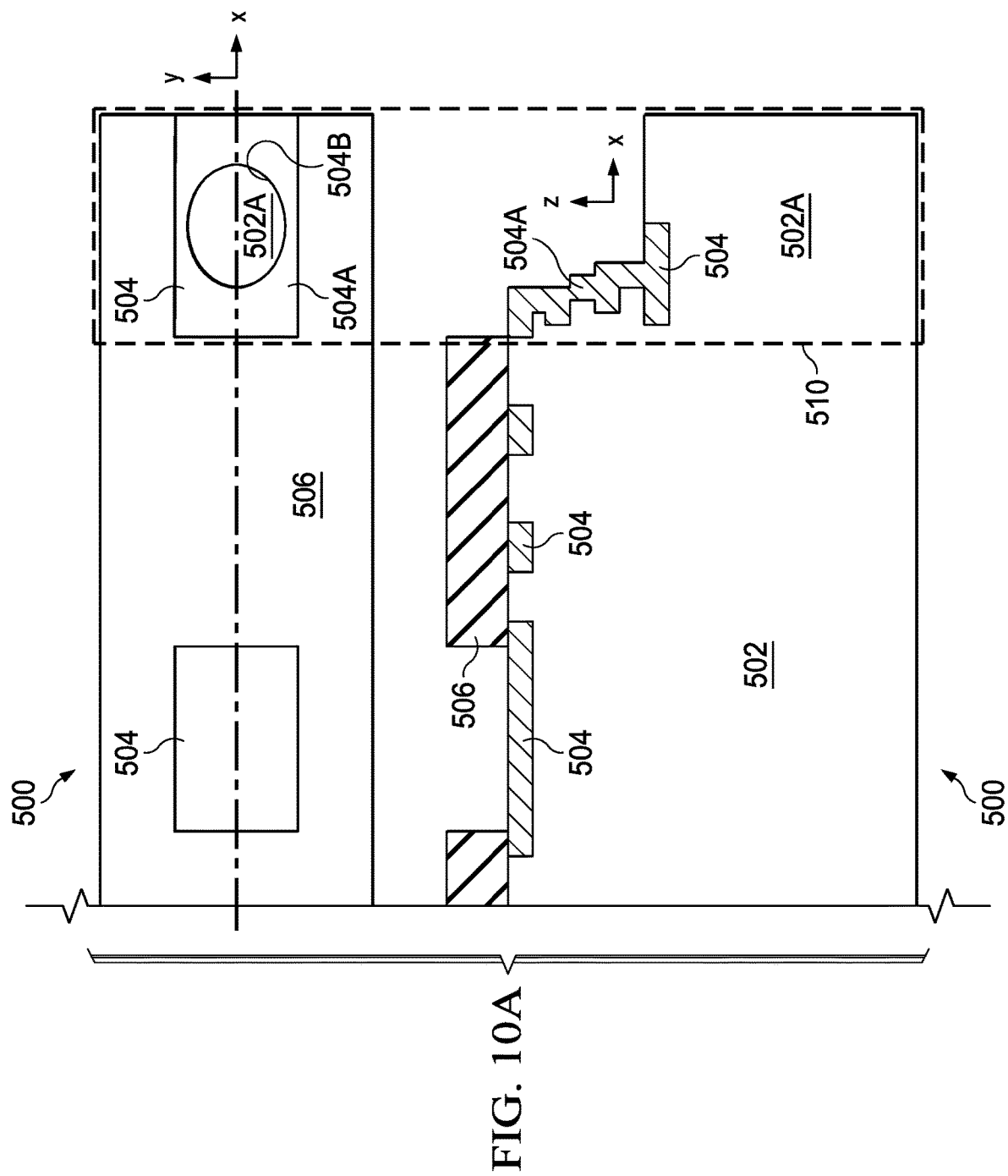

FIGS. 10A-10E illustrate an example process for forming U-shaped, cup-shaped, or arch-shaped contacts on a VMD, according to one example embodiment. FIG. 10A shows a top-down view (top) and a cross-sectional view (bottom) of a section of a VMD die wafer 500. As shown, conductive structures 504 are formed on a VMD body 502. Conductive structures 504 may include including metal lines, interconnects, vias, and/or other conductive structures formed from a conductive metal, e.g., copper or aluminum.

A leading end portion 502A of the VMD body 502 may have a reduced dimension in at least one direction (e.g., the z-direction shown in FIG. 10A). This reduced-sized leading end portion 502A may be sized for insertion into a VMD slot formed in a die mount base 404, for example as shown in FIG. 9 with respect to leading portion 412A of VMD 412 configured for insertion into VMD slot 420. The leading end portion 502A of VMD body 502 may be formed in a scribe line region 510 through which the VMD die wafer 500 may subsequently be cut or diced (where the width of the cut is smaller than the scribe region 510, and thus removes only a portion of the scribe region 510), e.g., as discussed below with reference to FIG. 10E. Conductive structures 504 may include a contact coupling structure 504A on, or at, the leading end portion 502A for conductively connecting a subsequently formed contact 552 (to be described in relation to FIG. 10B) to at least one conductive structure 504 and/or other electronic elements provided in the VMD die wafer 500. The contact coupling structure 504A may comprise a three-dimensional structure extending along the x-direction, y-direction, and z-directions shown in FIG. 10A.

The contact coupling structure 504A may be shaped and sized for creating a U-shape, cup-shape, or arched contact 552 configured for engagement with a corresponding VMD contact on an MOMD die mount base upon mounting the VMD to the die mount base, as discussed below. For example, as shown in the top view at the upper portion of FIG. 10A, the contact coupling structure 504A may define a curved opening 504B that exposes a portion of the leading end portion 502A of the VMD body 502. The curved opening 504B may define a circular shape, oval shape, elliptical shape, or other curved shape. Further, as shown in the cross-section view in the lower portion of FIG. 10A, the contact coupling structure 504A may extend in the z-direction, e.g., by forming a series of contiguously connected metal structures at multiple successive layers in the x-direction.

A passivation layer 506 may be formed over the VMD die wafer 500 and patterned and etched to expose selected regions of the conductive structures 504.

Figure 10B:
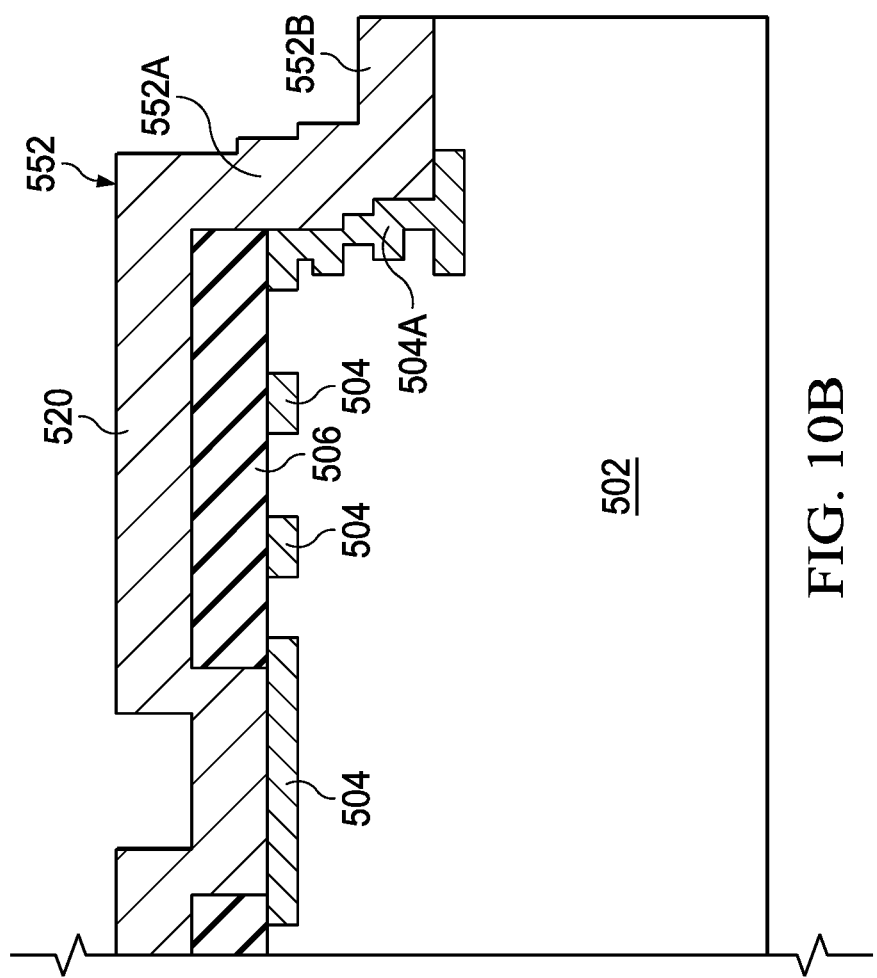

As shown in the cross-sectional view of FIG. 10B, a metal layer 520 may be deposited over the VMD die wafer 500, extending over exposed surfaces of the passivation layer 506, conductive structures 504 (including contact coupling structure 504A), and/or VMD body 502. In some embodiments, metal layer 520 may comprise aluminum, copper, or other soft metal. The metal layer 520 may include a contact portion 552 in contact with the underlying contact coupling structure 504A. The contact portion 552 may include (a) have a U-shaped, cup-shaped, or arch-shaped portion 552A when viewed from a top view (i.e., the perspective of the top portion of FIG. 10A) and (b) a flat or planar base or back portion 552B.

Figure 10C:
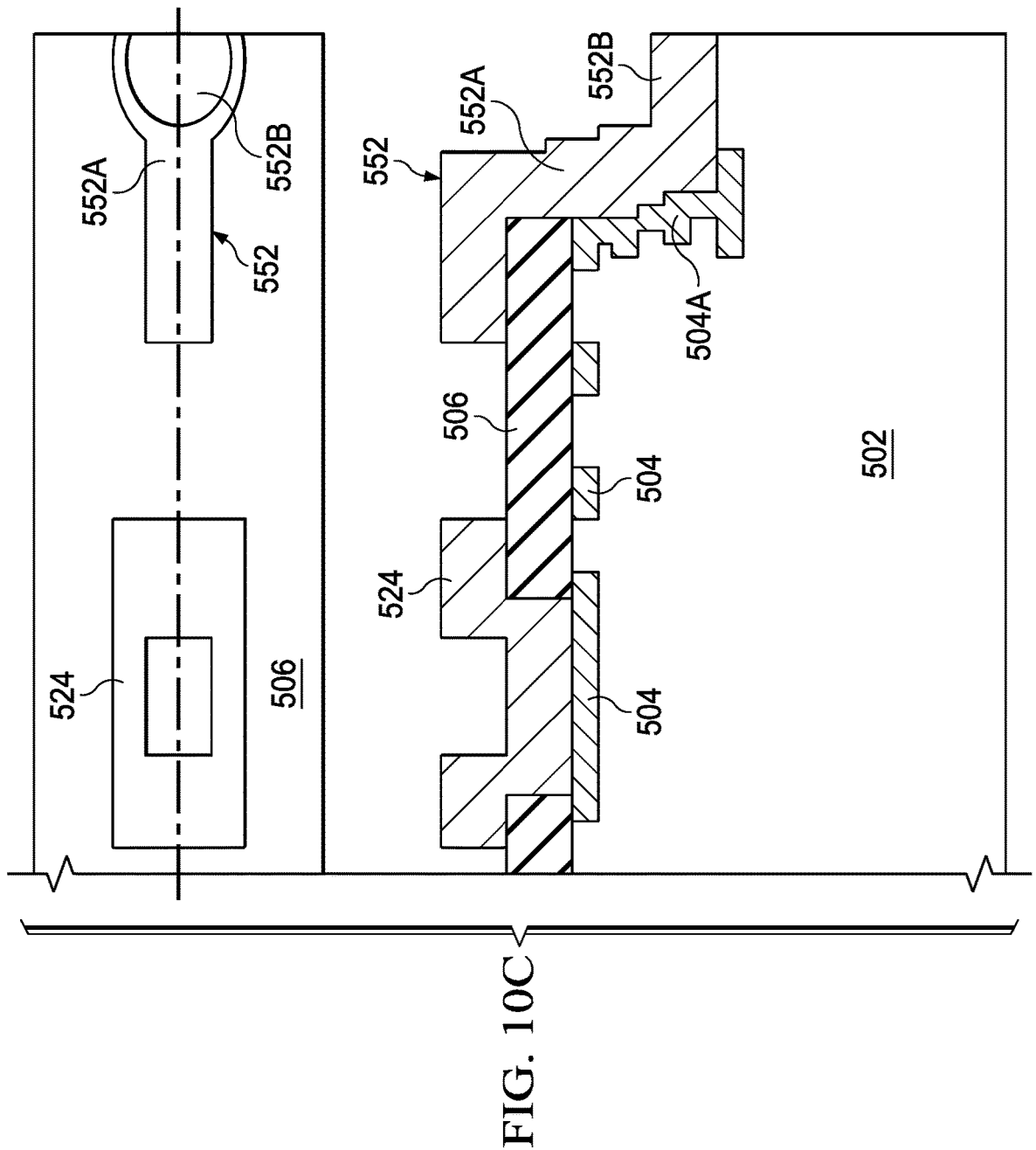

As shown in the cross-sectional view of FIG. 10C, the metal layer 520 is patterned and etched, using any known photolithographic techniques, to define (a) a contact 552 defined by remaining contact portions 552A and 552B and/or (b) one or more additional metal structures 524, which may define (i) at least one conductive contact pad and/or (ii) at least one alignment structure configured to interact with corresponding alignment structures provided on an MOMD die mount base to align and/or guide the mounting of the VMD to the die mount base, e.g., at shown in FIGS. 5A-5C with respect to alignment structures 250 that interact with alignment structures 222 provided on die mount base 204.

Figure 10D:
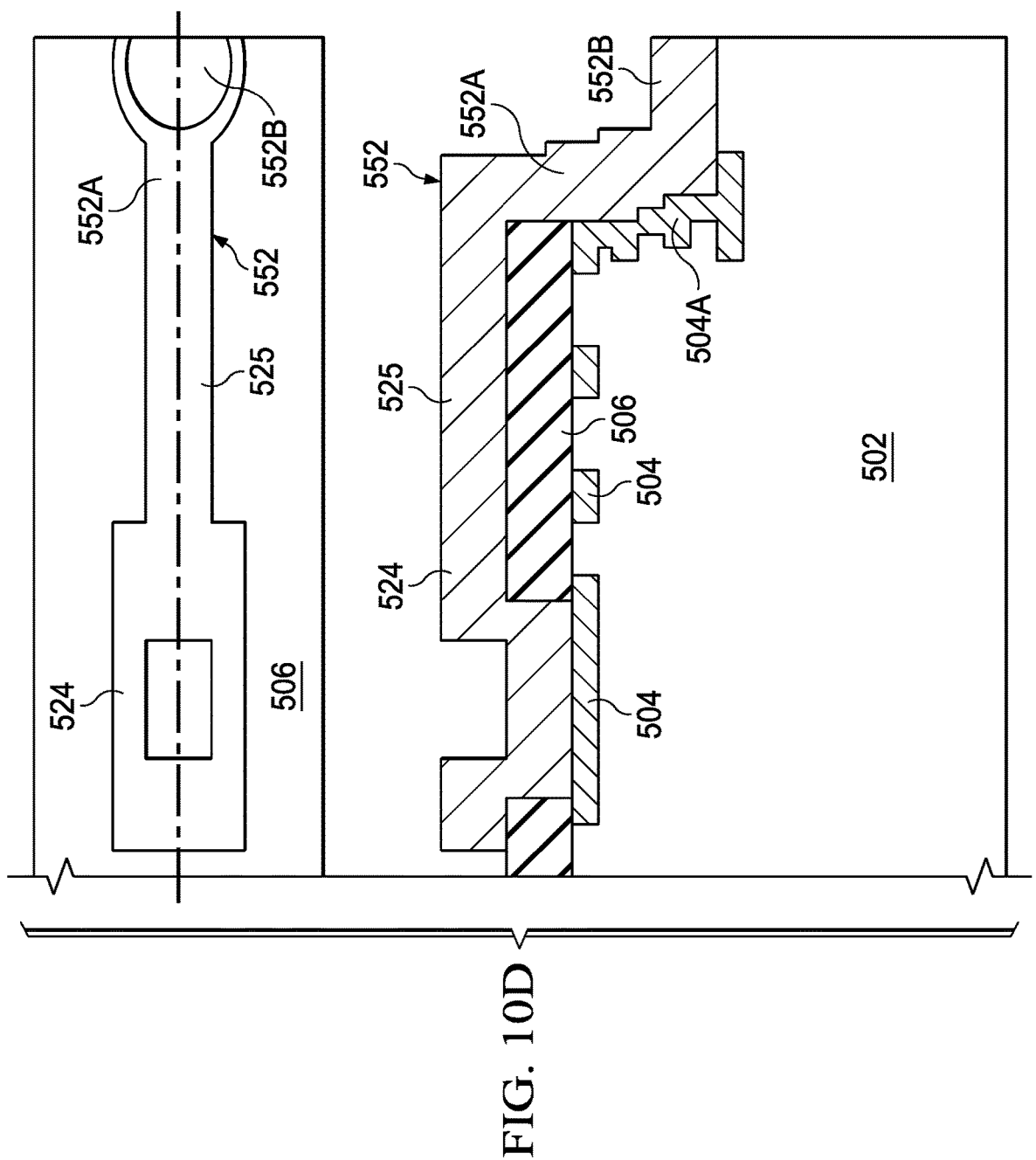

FIG. 10D shows an alternative embodiment, in which contact 552 is connected to a contact structure 524 by an exterior metal strap 525 formed on the passivation layer 506.

As shown in the cross-sectional view of FIG. 10E, which continues from the embodiment shown in FIG. 10C, the VMD die wafer 500 may be cut or diced as indicated by dashed line D, e.g., by a laser die cut operation, to thereby define a VMD 512 configured for vertical mounting to a die mount base.

Figure 11:
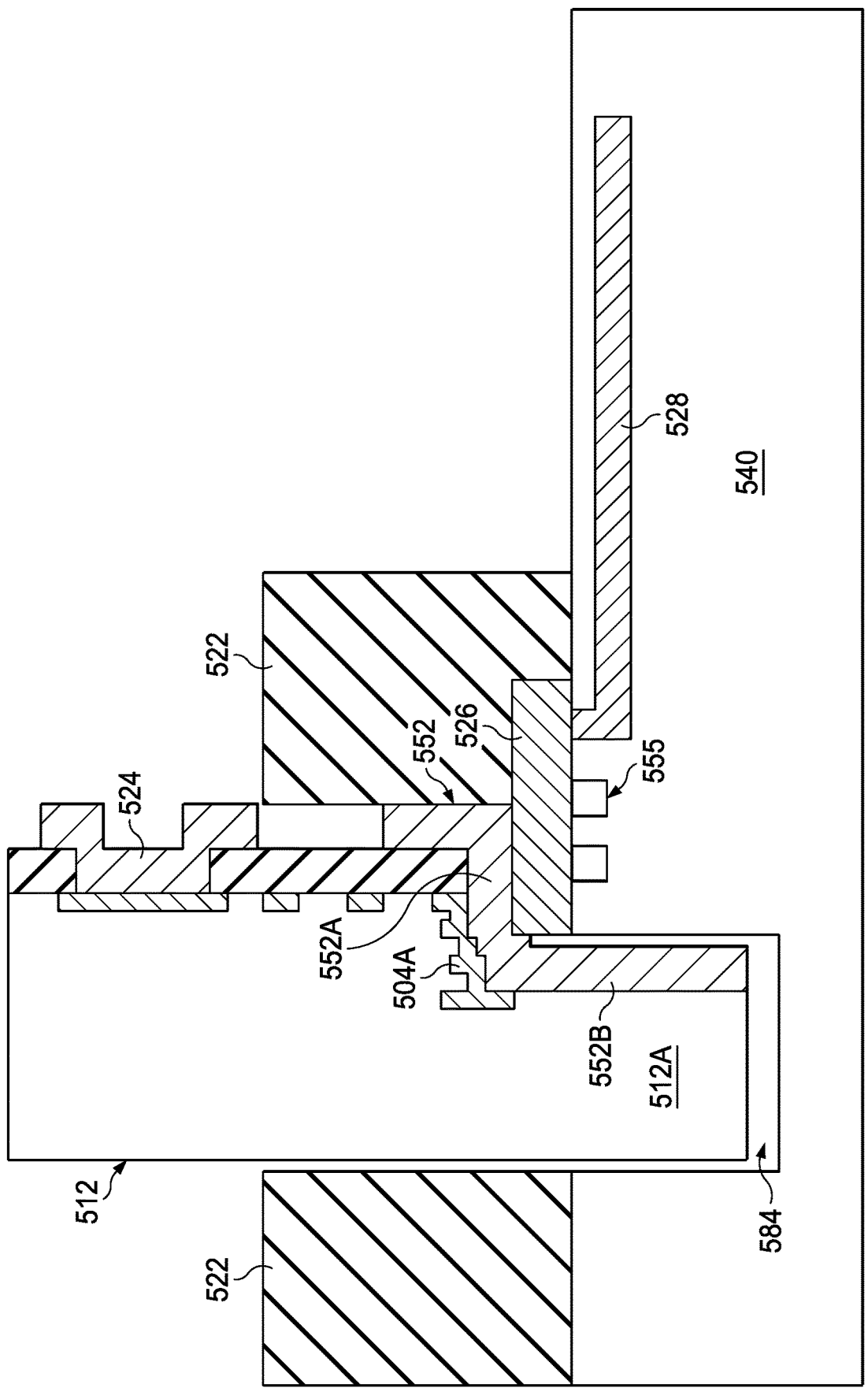
FIG. 11 is a cross-sectional view showing an example VMD, formed according to the process shown in FIGS. 10A-10E, mounted to an example MOMD die mount base, according to one example embodiment.

FIG. 11 is a cross-sectional view showing the example VMD 512 (formed according to the process shown in FIGS. 10A-10E) mounted to an example MOMD die mount base 540, according to one example embodiment. In this example, the VMD 512 is mounted vertically between a pair of polyimide alignment structures 522, with a leading portion 512A of VMD 512 received in a VMD slot 584 formed in the die mount base 540. The U-shaped, cup-shaped, or arched contact portion 552A of contact 552 on the VMD 512 engages with a tin-coated aluminum contact pad 526 provided on the die mount base 540, which is connected to a copper interconnect 528 formed within the die mount base 540. The U-shaped, cup-shaped, or arched contact portion 552A may wrap around the contact pad 526, and the contact portion 552A and/or the contact pad 526 may deform upon downward pressure applied to the VMD 512, to provide an improved contact between contact 552 and contact pad 526. A solder process may then be performed to solder the contact portion 552A to the contact pad 526. The die mount base 540 may include one or more voids or shock pad structures 555 underneath the contact pad 526 to prevent or reduce cracking or other physical damage caused by the mounting of the VMD 512.

The invention claimed is:

1. A mixed-orientation multi-die package, comprising:
   a horizontally-extending die mount base;
   a vertically-extending slot formed in the horizontally-extending die mount base;
   a first die mounted to the horizontally-extending die mount base in a horizontal orientation; and
   a second die mounted to the horizontally-extending die mount base in a vertical orientation, wherein the second die is inserted in the vertically-extending slot in the die mount base.

2. The mixed-orientation multi-die package of claim 1, further comprising a package substrate, wherein the horizontally-extending die mount base is mounted on and electrically coupled to the package substrate.

3. The mixed-orientation multi-die package of claim 1, wherein a portion of metal layers required for operation of the first die are formed in the die mount base rather than in the particular first die itself.

4. The mixed-orientation multi-die package of claim 1, further comprising at least one additional die mounted to the horizontally-extending die mount base in the vertical orientation.

5. The mixed-orientation multi-die package of claim 1, further comprising:
at least one additional die mounted to the horizontally-extending die mount base in the horizontal orientation; and
at least one additional die mounted to the horizontally-extending die mount base in the vertical orientation.

6. A mixed-orientation multi-die package, comprising:
a horizontally-extending die mount base;
a high-performance die having an operating frequency of at least 300 MHz mounted to the horizontally-extending die mount base in a horizontal orientation; and
a non-high-performance die mounted to the horizontally-extending die mount base in a vertical orientation.

7. The mixed-orientation multi-die package of claim 6, further comprising a package substrate, wherein the horizontally-extending die mount base is mounted on and electrically coupled to the package substrate.

8. The mixed-orientation multi-die package of claim 6, wherein:
the high-performance die mounted to the horizontally-extending die mount base in the horizontal orientation comprises a microcontroller or microprocessor; and
the non-high-performance die mounted to the horizontally-extending die mount base in the vertical orientation comprises a memory device, an analog device, or a sensor.

9. The mixed-orientation multi-die package of claim 6, wherein a portion of metal layers required for operation of the first die are formed in the die mount base rather than in the particular first die itself.

10. The mixed-orientation multi-die package of claim 6, further comprising:
at least one additional high-performance die mounted to the horizontally-extending die mount base in the horizontal orientation; and
at least one additional non-high-performance die mounted to the horizontally-extending die mount base in the vertical orientation.

11. A mixed-orientation multi-die package, comprising:
a horizontally-extending die mount base;
a first die mounted to the horizontally-extending die mount base in a horizontal orientation;
a second die mounted to the horizontally-extending die mount base in a vertical orientation;
first alignment structures provided on the second die; and
second alignment structures provided on the die mount base;
wherein the first and second alignment structures are configured to interact to guide a vertical mounting of the particular second die to the die mount base.

12. The mixed-orientation multi-die package of claim 11, wherein the second alignment structures project upwardly from an upper side of the die mount base.

13. The mixed-orientation multi-die package of claim 11, wherein the second alignment structures are formed from a flexible or malleable material.

14. The mixed-orientation multi-die package of claim 11, further comprising a package substrate, wherein the horizontally-extending die mount base is mounted on and electrically coupled to the package substrate.

15. A mixed-orientation multi-die package, comprising:
a horizontally-extending die mount base;
a first die mounted to the horizontally-extending die mount base in a horizontal orientation;
a second die mounted to the horizontally-extending die mount base in a vertical orientation;
wherein the second die includes a contact formed in a scribe line region and providing a conductive connection to the horizontally-extending die mount base.

16. The mixed-orientation multi-die package of claim 15, wherein the contact formed in the scribe line region of the second die includes a U-shaped, cup-shaped, or arch-shaped contact element.

17. A method of assembling a mixed-orientation multi-die package, comprising:
providing a horizontally-extending die mount base including a vertically-extending slot;
mounting a first die to the horizontally-extending die mount base in a horizontal orientation; and
mounting a second die to the horizontally-extending die mount base in a vertical orientation by vertically inserting at least a portion of the second die in the vertically-extending slot.

18. The method of claim 17, further comprising mounting and bonding the horizontally-extending die mount base to an underlying package substrate.

19. The method of claim 17, further comprising:
mounting at least one additional die to the horizontally-extending die mount base in the horizontal orientation; and
mounting at least one additional die to the horizontally-extending die mount base in the vertical orientation.

20. The method of claim 17, wherein:
mounting the first die in the horizontal orientation comprises mounting a high-performance device, having an operating frequency of at least 300 MHz, in the horizontal orientation; and
mounting the second die in the vertical orientation comprises mounting a non-high-performance device in the vertical orientation.

21. The method of claim 17, wherein:
the die mount based includes a first conductive contact;
the second die includes a second conductive contact formed in a scribe line region of the second die; and
mounting the second die to the horizontally-extending die mount base in the vertical orientation comprises forming a conductive connection between the second conductive contact formed in the scribe line region of the second die and the first conductive contact of the die mount base.

22. The method of claim 17, wherein:
the die mount base includes at least one first alignment structure projecting from an upper side of the die mount base;
the second die includes at least one second alignment structure; and
the at least one first alignment structure and the at least one second alignment structure cooperate to align the second die during mounting of the second die to the horizontally-extending die mount base in the vertical orientation.

23. A method of assembling a mixed-orientation multi-die package, comprising:
providing a horizontally-extending die mount base including at least one first alignment structure projecting from an upper side of the die mount base;

mounting a first die to the horizontally-extending die mount base in a horizontal orientation; and mounting a second die to the horizontally-extending die mount base in a vertical orientation;

wherein the second die includes at least one second alignment structure; and mounting the second die to the die mount base in a vertical orientation comprises aligning the at least one second alignment structure of the second die with the at least one first alignment structure projecting from the upper side of the die mount base.

24. The method of claim 23, wherein:

the die mount based includes at least one first conductive contact;

the second die includes at least one second conductive contact formed in a scribe line region of the second die; and mounting the second die to the horizontally-extending die mount base in the vertical orientation comprises forming a conductive connection between the second conductive contact formed in the scribe line region of the second die and the first conductive contact of the die mount base.

\* \* \* \* \*